United States Patent
Sakai

(10) Patent No.: US 12,268,039 B2
(45) Date of Patent: Apr. 1, 2025

(54) LIGHT-EMITTING DEVICE AND MANUFACTURING METHOD THEREFOR

(71) Applicants: Citizen Electronics Co., Ltd., Fujiyoshida (JP); Citizen Watch Co., Ltd., Nishitokyo (JP)

(72) Inventor: Keisuke Sakai, Fujiyoshida (JP)

(73) Assignees: Citizen Electronics Co., Ltd., Fujiyoshida (JP); Citizen Watch Co., Ltd., Nishitokyo (JP)

( * ) Notice: Subject to any disclaimer, the term of this patent is extended or adjusted under 35 U.S.C. 154(b) by 0 days.

(21) Appl. No.: 18/723,335

(22) PCT Filed: Dec. 27, 2022

(86) PCT No.: PCT/JP2022/048277
§ 371 (c)(1),
(2) Date: Jun. 21, 2024

(87) PCT Pub. No.: WO2023/127897
PCT Pub. Date: Jul. 6, 2023

(65) Prior Publication Data
US 2024/0421274 A1    Dec. 19, 2024

(30) Foreign Application Priority Data

Dec. 27, 2021  (JP) .................. 2021-213359

(51) Int. Cl.
*H10H 20/856* (2025.01)
*H01L 25/075* (2006.01)
*H10H 20/01* (2025.01)

(52) U.S. Cl.
CPC ....... *H10H 20/856* (2025.01); *H01L 25/0753* (2013.01); *H10H 20/0363* (2025.01)

(58) Field of Classification Search
CPC .. H10H 20/852; H10H 20/854; H10H 20/856; H10H 20/855; H01L 25/167
See application file for complete search history.

(56) References Cited

U.S. PATENT DOCUMENTS

| 2006/0055309 | A1 | 3/2006 | Ono et al. |
| 2014/0203305 | A1* | 7/2014 | Kawano ............ H10D 30/6215 438/28 |
| 2019/0097094 | A1 | 3/2019 | Han et al. |

FOREIGN PATENT DOCUMENTS

| JP | H07-297996 A | 11/1995 |
| JP | 2006-086191 A | 3/2006 |

(Continued)

OTHER PUBLICATIONS

International Search Report received in co-pending International Application No. PCT/JP2022/048277, mailed Mar. 14, 2023, in 6 pages, with translation.

(Continued)

*Primary Examiner* — Antonio B Crite
(74) *Attorney, Agent, or Firm* — Procopio, Cory, Hargreaves & Savitch LLP

(57) ABSTRACT

A light emitting device has a substrate, a plurality of first light emitting elements, each of which is mounted on the substrate, has a first LED die, and emits light having a first wavelength, a first light transmitting layer arranged so as to cover the plurality of first light emitting elements, the first light transmitting layer transmitting light emitted from the plurality of first light emitting elements, a second light transmitting layer arranged so as to cover the first light transmitting layer, the second light transmitting layer transmitting light that has transmitted through the first light transmitting layer, and a reflector having an upwardly bulging curved surface at an upper portion of an inner wall that (Continued)

the first light transmitting layer and the second light transmitting layer contact, the reflector being arranged on the substrate so as to surround the plurality of first light emitting elements and reflecting light emitted from the first light emitting elements, wherein the thickness T between the upper surfaces of the first LED dies and the upper surface of the first light transmitting layer is greater than a thickness T1 defined as $$T1 = LG1/(2\tan\theta c)$$

wherein LG1 is the distance between the first LED dies, and θc is a critical angle for the case where light is emitted from the first light transmitting layer to air, and the horizontal distance between a second contact part, where the top of the second light transmitting layer contacts the curved surface of the reflector, and the bottom of the inner wall of the reflector is greater than the horizontal distance between a first contact part, where the top of the first light transmitting layer contacts the reflector, and the bottom of the inner wall of the reflector.

16 Claims, 27 Drawing Sheets

(56) References Cited

FOREIGN PATENT DOCUMENTS

| | | | |
|---|---|---|---|
| JP | 2007-180339 A | 7/2007 | |
| JP | 2008-041290 A | 2/2008 | |
| JP | 2009-135485 A | 6/2009 | |
| JP | 2011-009680 A | 1/2011 | |
| JP | 2014-138185 A | 7/2014 | |
| JP | 6095479 B2 | 3/2017 | |
| JP | 2019061954 A * | 4/2019 | ............ F21K 9/235 |

OTHER PUBLICATIONS

Written Opinion received in co-pending International Application No. PCT/JP2022/048277, mailed Jan. 23, 2024, in 8 pages, with translation.

* cited by examiner

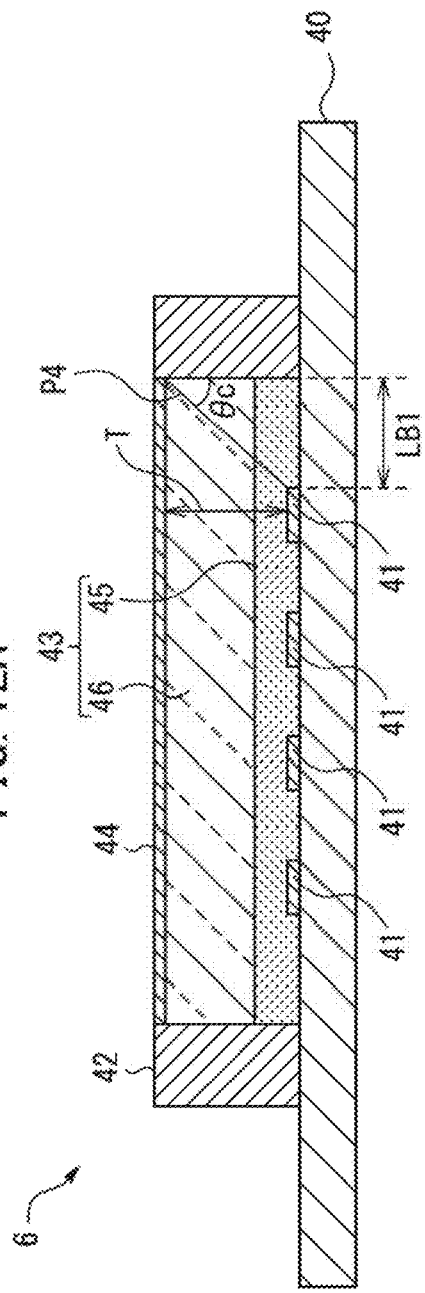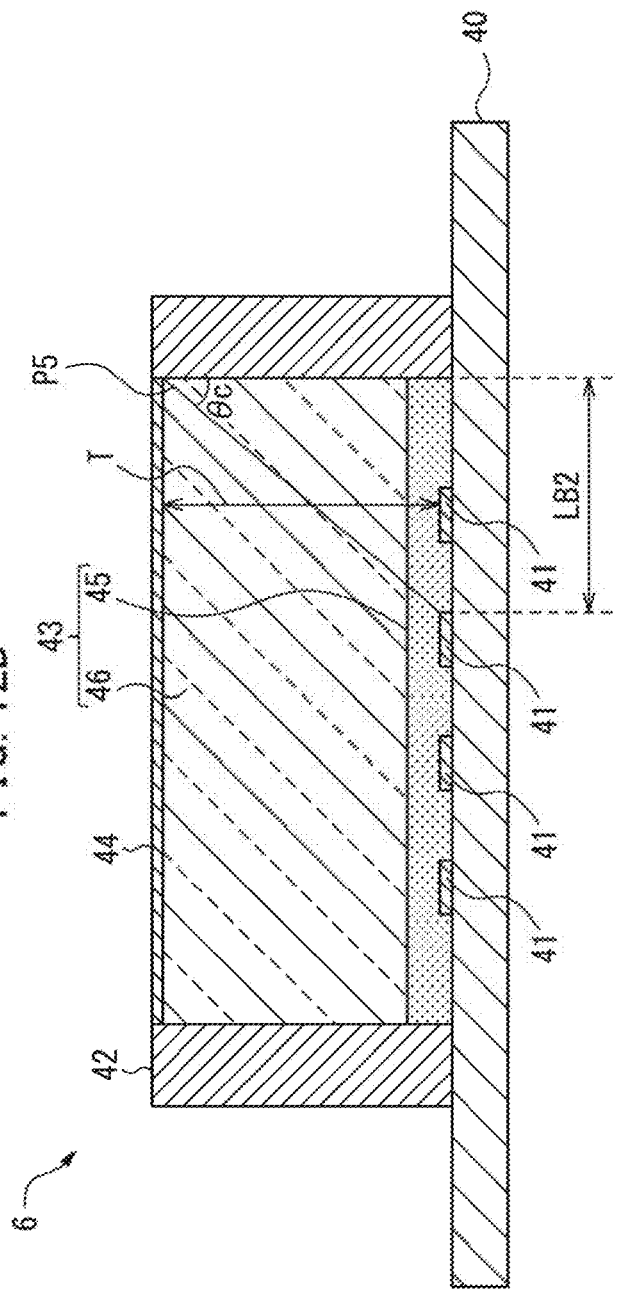

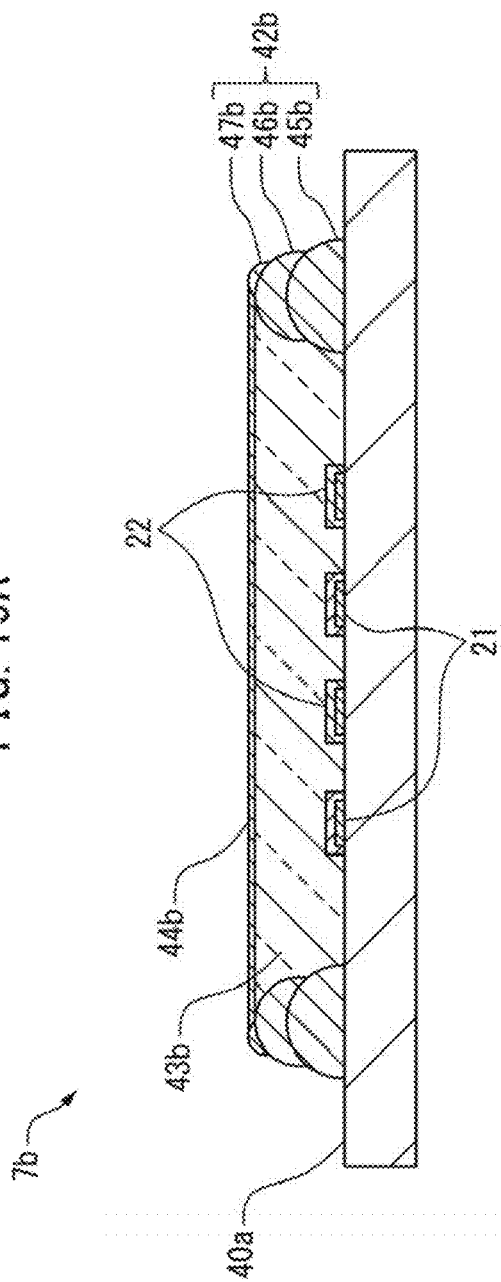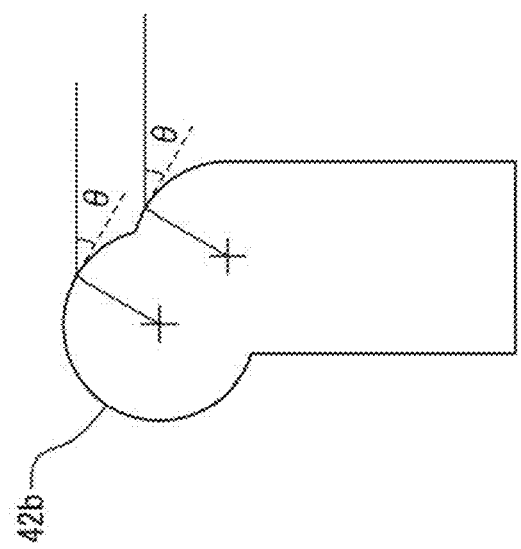

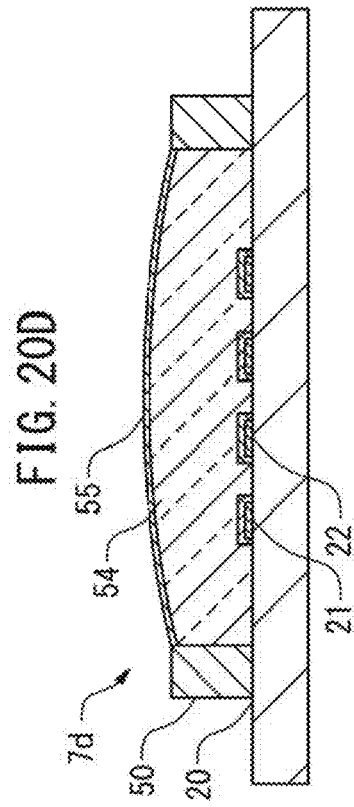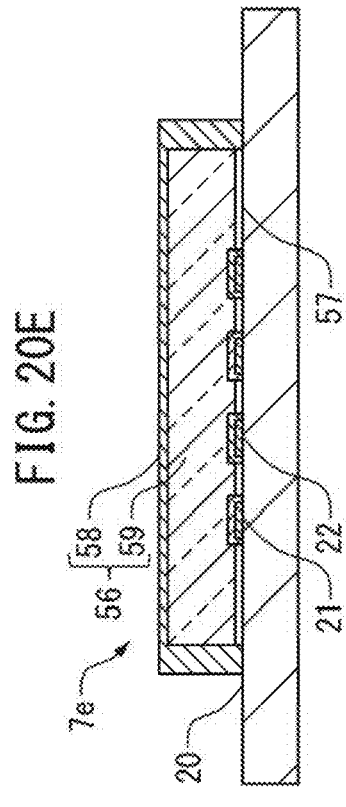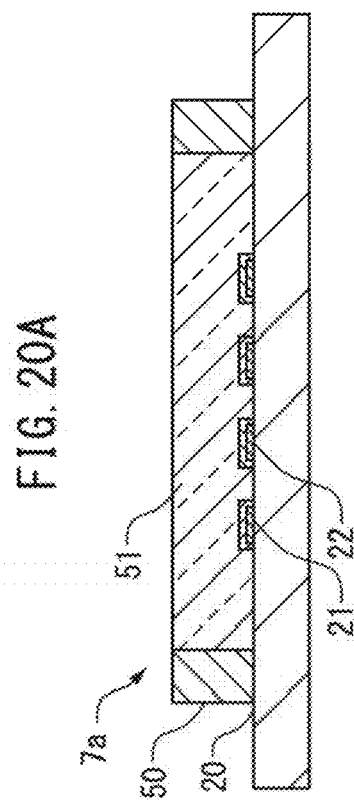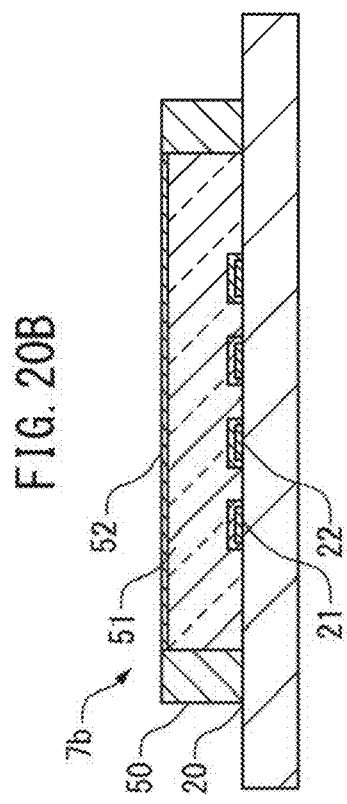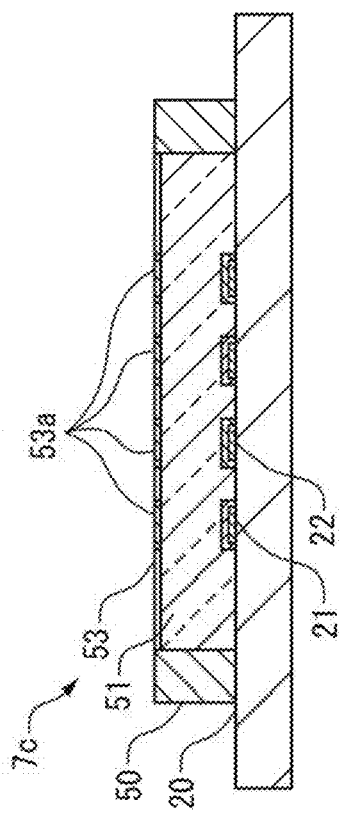

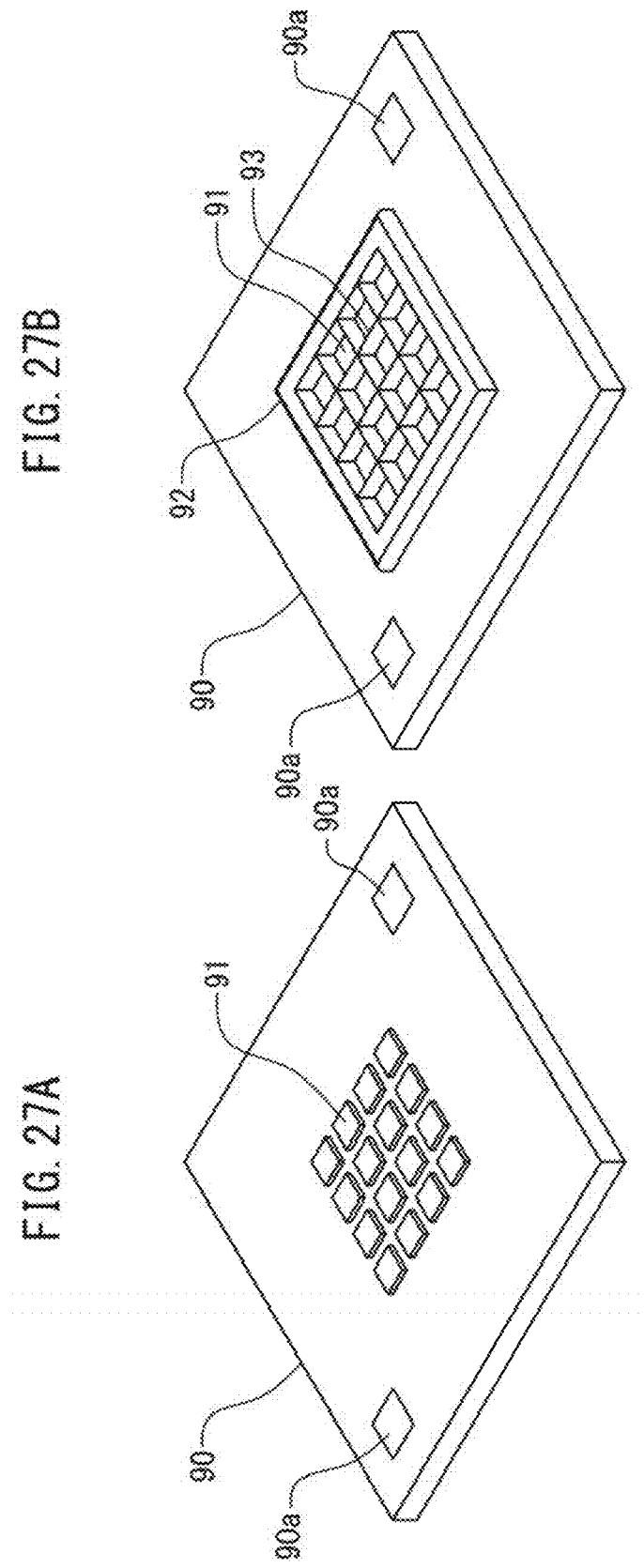

LIGHT-EMITTING DEVICE AND MANUFACTURING METHOD THEREFOR

TECHNICAL FIELD

The present disclosure relates to a light emitting device and manufacturing method therefor.

BACKGROUND

A Light emitting device is known that includes a plurality of modularized light emitting elements arranged on the upper surface of a substrate, and attached to a lighting fixture so as to function as a light source of the lighting fixture. The light emitting elements included in the light emitting device are LED dies coated with phosphor, or LED modules formed by packaged LED dies coated with phosphor, etc., and mainly emit light from the upper surfaces thereof. Further, a light emitting device having a large number of arranged light emitting elements is known in which a white LED package is arranged for each color filter section including a large number of color-specific sections. Although various small light emitting elements may be employed as light emitting elements, an LED die is described as an exemplary light emitting element in the present disclosure.

A light emitting device is described in JP 2006-86191 in which light emitting elements having LED dies and phosphor layers for covering the LED dies are arranged in the divided sections formed by dividing the light emitting surface into a plurality of sections by a frame-shaped light shielding member. Further, a light emitting device is described in Japanese Patent No. 6095479 in which chip size packages (CSP) for emitting warm light and CSPs for emitting cool light are arranged alternately, and a white reflective resin is filled between the CSPs. The CSP is an example of a light emitting element that includes a fluorescent resin for coating the upper and side surfaces of an LED die and electrodes formed on the lower surface, and has a planar size similar to that of the LED die.

In the light emitting devices described in JP 2006-86191 and Japanese Patent No. 6095479, a person about 1 m away from the light emitting devices may recognize light emitting elements thereon as graininess when the light emitting devices emit light. When a diffusion plate is arranged between the light emitting devices and the person, the brightness of the light emitted from the light emitting devices is made uniform, and therefore the light emitting elements may be prevented from being recognized as having graininess. It is known that the brightness of the light emitted from the light emitting devices is uniform when a distance between the light emitting devices and the diffusion plate is great, or the diffusion degree of the diffusion plate is increased.

However, the size of a light fixture is large, when the distance between the light emitting devices and the diffusion plate is great. Further, the luminous efficiency of a light fixture is reduced, when the diffusion degree of the diffusion plate is increased. An object of the present disclosure is to provide a light emitting device capable of emitting light having more uniform brightness and a manufacturing method therefor, in order to overcome the above problem.

A light emitting device according to the present disclosure has a substrate, a plurality of first light emitting elements, each of which is mounted on the substrate, has a first LED die, and emits light having a first wavelength, a first light transmitting layer arranged so as to cover the plurality of first light emitting elements, the first light transmitting layer transmitting light emitted from the plurality of first light emitting elements, a second light transmitting layer arranged so as to cover the first light transmitting layer, the second light transmitting layer transmitting light that has transmitted through the first light transmitting layer, and a reflector having an upwardly bulging curved surface at an upper portion of an inner wall that the first light transmitting layer and the second light transmitting layer contact, the reflector being arranged on the substrate so as to surround the plurality of first light emitting elements and reflecting light emitted from the first light emitting elements, wherein the thickness T between the upper surfaces of the first LED dies and the upper surface of the first light transmitting layer is greater than a thickness T1 defined as $$T1 = LG1/(2\tan\theta c)$$

wherein LG1 is the distance between the first LED dies, and θc is a critical angle for the case where light is emitted from the first light transmitting layer to air, and the horizontal distance between a second contact part, where the top of the second light transmitting layer contacts the curved surface of the reflector, and the bottom of the inner wall of the reflector is greater than the horizontal distance between a first contact part, where the top of the first light transmitting layer contacts the reflector, and the bottom of the inner wall of the reflector.

It is preferable for the light emitting device according to the present disclosure that the second contact part, where the top of the second light transmitting layer contacts the curved surface of the reflector, is higher than the first contact part, where the top of the first light transmitting layer contacts the reflector.

It is preferable for the light emitting device according to the present disclosure that the reflector includes a plurality of layers being superposed.

It is preferable for the light emitting device according to the present disclosure that one of the plurality of layers is narrower than another of the plurality of layers arranged between the one of the plurality of layers and the substrate.

It is preferable for the light emitting device according to the present disclosure that the first light transmitting layer at the center of a mounting region where the plurality of first light emitting elements is mounted is thinner than the first light transmitting layer at the first contact part.

It is preferable for the light emitting device according to the present disclosure that the thickness of the first light transmitting layer decreases with the distance from the first contact part.

It is preferable for the light emitting device according to the present disclosure that the second light transmitting layer at the center of a mounting region where the plurality of first light emitting elements is mounted is thicker than the second light transmitting layer at the second contact part.

It is preferable for the light emitting device according to the present disclosure that the thickness of the second light transmitting layer increases with the distance from the second contact part.

It is preferable for the light emitting device according to the present disclosure that at least one layer arranged below a top layer of the reflector has an upwardly bulging curved surface as an upper surface, and a top part of the top layer of the reflector is arranged outside a top part of the layer arranged below the top layer and having a curved surface.

It is preferable for the light emitting device according to the present disclosure that the first contact part contacts the curved surface of the layer arranged below the top layer, and the second contact part contacts the curved surface of the top layer.

It is preferable for the light emitting device according to the present disclosure that the first light transmitting layer at the center of a mounting region where the plurality of first light emitting elements is mounted is as thick as the first light transmitting layer at the first contact part.

It is preferable for the light emitting device according to the present disclosure that the second light transmitting layer at the center of a mounting region where the plurality of first light emitting elements is mounted is as thick as the second light transmitting layer at the first contact part.

It is preferable for the light emitting device according to the present disclosure that the first light transmitting layer is a light guide layer that guides light emitted from the plurality of first light emitting elements to the second light transmitting layer, and the second light transmitting layer is a diffusion layer that diffuses light guided through the light guide layer.

It is preferable for the light emitting device according to the present disclosure that the second light transmitting layer contains a first diffusion material and a second diffusion material that differs in composition from the first diffusion material.

It is preferable for the light emitting device according to the present disclosure that the first light emitting elements are blue light emitting elements that emit blue light, the first light transmitting layer is a light guide layer that guides light emitted from the plurality of first light emitting elements to the second light transmitting layer, and the second light transmitting layer is a fluorescent layer containing a phosphor that absorbs blue light guided through the light guide layer to emit light.

It is preferable that the light emitting device according to the present disclosure further has a white resin arranged so as to surround each of the plurality of first light emitting elements.

A manufacturing method of the light emitting device according to the present disclosure has a substrate preparation step to prepare a substrate, a light emitting element mounting step to mount first light emitting elements each having a first LED die on the substrate, a reflector arrangement step to arrange a reflector so as to surround the first light emitting elements, a first light transmitting layer arrangement step to arrange a first light transmitting layer so as to cover the first light emitting elements, and a second light transmitting layer arrangement step to arrange a second light transmitting layer so as to cover the first light transmitting layer, wherein the reflector has an upwardly bulging curved surface at an upper portion of an inner wall that the first light transmitting layer and the second light transmitting layer contact, and the reflector is arranged on the substrate so as to surround the first light emitting elements and reflects light emitted from the first light emitting elements, the thickness T between the upper surfaces of the first LED dies and the upper surface of the first light transmitting layer is greater than a thickness T1 defined as $$T1 = LG1/(2\tan\theta c)$$

wherein LG1 is the distance between the first LED dies, and θc is a critical angle for the case where light is emitted from the first light transmitting layer to air, and the horizontal distance between a second contact part, where the top of the second light transmitting layer contacts the curved surface of the reflector, and the bottom of the inner wall of the reflector is greater than the horizontal distance between a first contact part, where the top of the first light transmitting layer contacts the reflector, and the bottom of the inner wall of the reflector.

It is preferable for the manufacturing method of the light emitting device according to the present disclosure that the second light transmitting layer arrangement step has the steps of applying an uncured raw material of the second light transmitting layer containing a diffusion material, and curing the applied uncured raw material of the second light transmitting layer to form the second light transmitting layer having a uniform thickness.

It is preferable that the manufacturing method of the light emitting device according to the present disclosure further has the steps of measuring the chromaticity of light emitted from the first light transmitting layer in response to a current supplied to the first light emitting elements, before the second light transmitting layer arrangement step, and determining the amount of the uncured raw material of the second light transmitting layer to be applied, so that the chromaticity of light emitted from the second light transmitting layer is the same as predetermined chromaticity.

A light emitting device according the present disclosure may emit light having more uniform brightness.

BRIEF DESCRIPTION OF THE DRAWINGS

FIG. 12A is a cross-sectional view of the light emitting device along C-C' shown in FIG. 11 (part 1);

FIG. 12B is a cross-sectional view of the light emitting device along C-C' shown in FIG. 11 (part 2);

FIG. 19A is FIG. 19A is a cross-sectional view of a light emitting device according to the sixth embodiment;

FIG. 19B is a diagram for explaining the structure of a reflector shown in FIG. 19A;

FIG. 20A is a cross-sectional view of a light emitting device according to a first modification;

FIG. 20B is a cross-sectional view of a light emitting device according to a second modification;

FIG. 20C is a cross-sectional view of a light emitting device according to a third modification;

FIG. 20D is a cross-sectional view of a light emitting device according to a fourth modification;

FIG. 20E is a cross-sectional view of a light emitting device according to a fifth modification;

FIG. 27A is shows a light emitting element mounting step in a manufacturing method of the light emitting device shown in FIG. 26; and FIG. 27B is shows a frame member arrangement step in a manufacturing method of the light emitting device shown in FIG. 26.

DESCRIPTION

Figure 1A:
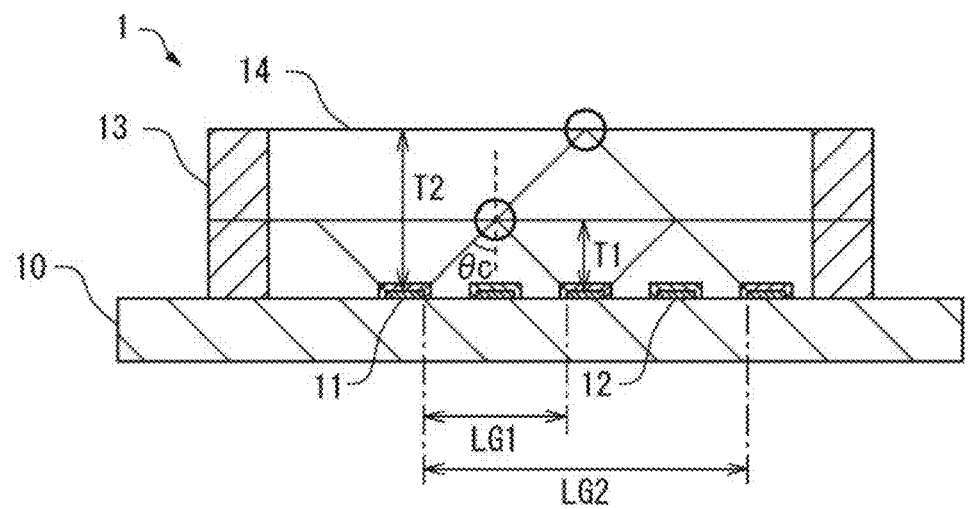
FIG. 1A is a diagram for explaining an outline of a light emitting device according to the present disclosure (Part 1)

Hereinafter, with reference to the drawings various embodiments will be explained. However, the technical scope of the present disclosure is not limited to these embodiments, but spans the claimed invention and its equivalents. Further, in the description of the drawings, the same or corresponding components are denoted by the same reference numerals, and overlapping descriptions are omitted. For the sake of explanation, the scales of the members are appropriately changed.

(Outline of a Light Emitting Device According to the Present Disclosure)

Figure 1B:
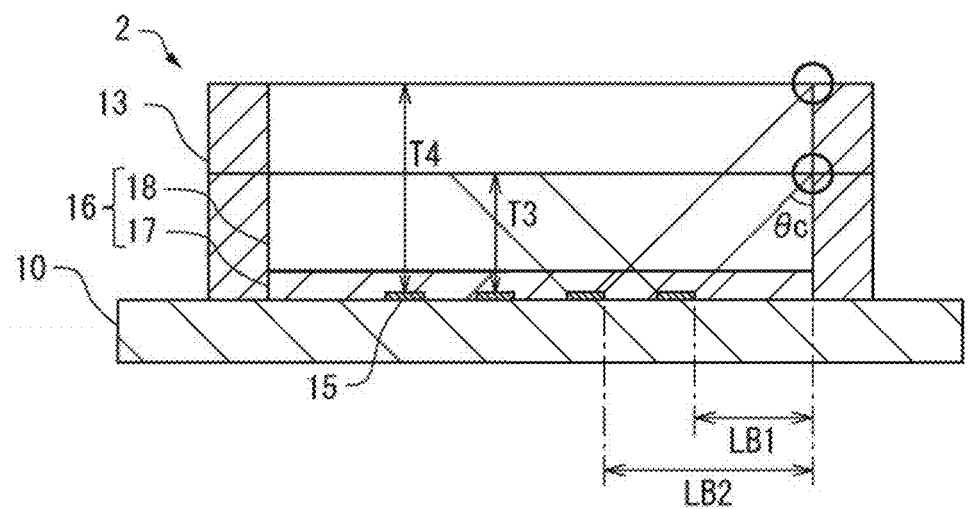
FIG. 1B is a diagram for explaining an outline of a light emitting device according to the present disclosure (Part 2)

FIG. 1A is a diagram for explaining an outline of a light emitting device according to the present disclosure (Part 1), and FIG. 1B is a diagram for explaining an outline of the light emitting device according to the present disclosure (Part 2). FIGS. 1A and 1B are cross-sectional views of light emitting devices according to the present disclosure.

The light emitting device 1 includes a substrate 10, first light emitting elements 11, second light emitting elements 12, a reflector 13 and a light guide layer 14. The substrate 10 is formed of a high thermal conductivity member such as ceramic and aluminum, the first and second light emitting elements 11 and 12 are mounted on the substrate 10. The first and second light emitting elements 11 and 12 are CSP-type light emitting elements having LED dies and sealing materials such as a silicone resin in which phosphor for emitting light having a first wavelength and a second wavelength by converting a wavelength of light emitted from each of the LED dies. The reflector 13 is formed of a silicone resin containing white particles such as Titanium Oxide ($TiO_2$), and is arranged so as to surround the first and second light emitting elements 11 and 12. The light guide layer 14 is a silicone resin for transmitting light emitted from the first and second light emitting elements 11 and 12, and is filled in a region surrounded by the reflector 13. The light emitting device 1 emits light having highly uniform brightness, when a thickness T between upper surfaces of the LED dies of the first and second light emitting elements 11 and 12 and the upper surface of the light guide layer 14 is equal to or longer than T1 and equal to or shorter than T2.

When a distance between LED dies of adjacent first light emitting elements 11 is LG1, and the critical angle when light is emitted from the light guide layer 14 to the air is θc, the minimum value T1 of the thickness T between the upper surfaces of the LED dies of the first light emitting elements 11 and the upper surface of the light guide layer 14 is indicated by $$T1 = LG1/(2\tan\theta c) \tag{1}$$

Further, when a distance between LED dies of two first light emitting elements 11 arranged through one first light emitting element 11 is LG2, the maximum value T2 of the thickness T between the upper surfaces of the LED dies of the first light emitting elements 11 and the upper surface of the light guide layer 14 is indicated by $$T2 = LG2 / (2\tan\theta c) \quad (2)$$

It is preferable that the thickness T between the upper surfaces of the LED dies of the first light emitting elements 11 and the upper surface of the light guide layer 14 is equal to or longer than 1 mm and equal to or shorter than 1.5 mm.

In the light emitting device 1, when the thickness T between the upper surfaces of the LED dies of the first light emitting elements 11 and the upper surface of the light guide layer 14 is equal to or longer than T1, light emitted from the first light emitting elements 11 is emitted over the entire upper surface of the light guide layer 14. Further, in the light emitting device 1, when the thickness T between the upper surfaces of the LED dies of the first light emitting elements 11 and the upper surface of the light guide layer 14 is equal to or shorter than T2, a thickness of the light guide layer 14 is thinner, and therefore an increase of manufacturing cost may be suppressed, and the luminous efficiency may be prevented from reducing. The heights of the LED dies of the second light emitting elements 12 are the same as those of the first light emitting elements 11, and the arrangement pitches of the LED dies of the second light emitting elements 12 are the same as those of the first light emitting elements 11.

Although a CSP-type light emitting element is employed in the light emitting device 1, the light emitting device 1 may be a chip-on-board (COB) type light emitting device including LED dies mounted on the substrate, or a surface mounted (SMD) type light emitting device.

A light emitting device 2 is different from the light emitting device 1 in that the light emitting device 2 includes first light emitting elements 15 and light guide layer 16 instead of first light emitting elements 11, the second light emitting elements 12 and a light guide layer 14. The first light emitting elements 15 are LED dies for emitting light having a first wavelength. The light guide layer 16 includes a phosphor layer 17 and a transparent layer 18. The phosphor layer 17 is a silicone resin in which phosphor that emits light having a second wavelength by converting the wavelength of the light emitted from the first light emitting elements 15 is contained. The transparent layer 18 is a silicone resin that transmits light emitted from the first light emitting elements 15 and the phosphor contained in the phosphor layer 17. The light emitting device 2 suppresses the occurrence of a yellow ring, when a thickness T between the upper surfaces of the first light emitting elements 15 and the upper surface of the light guide layer 16 is equal to or longer than T3 and equal to or shorter than T4.

When a distance between a first light emitting element 15 adjacent to the reflector 13 and the reflector 13 is LB1, the minimum value T3 of the thickness T between the upper surfaces of the first light emitting elements 15 and the upper surface of the light guide layer 16 is indicated by $$T3 = LB1 / \tan\theta c \quad (3)$$

In other words, the distance LB1 between the first light emitting element 15 adjacent to the reflector 13 and the reflector 13 is shorter than T tan θc.

Further, when a distance between a first light emitting element 15 arranged adjacent to the reflector 13 through one first light emitting element 15 and the reflector 13 is LB2, the maximum value T4 of the thickness T between the upper surface of the first light emitting elements 15 and the upper surface of the light guide layer 16 is indicated by $$T4 = LB2 / \tan\theta c \quad (4)$$

The distance LB2 between the first light emitting element 15 arranged adjacent to the reflector 13 through one first light emitting element 15 and the reflector 13 is longer than T tan θc.

In the light emitting device 2, light emitted from the first light emitting element 15 adjacent to the reflector 13 is emitted to the outer edge of the upper surface of the light guide layer 16 contacted with an inner edge of the reflector 13, when the thickness T between the upper surfaces of the first light emitting elements 15 and the upper surface of the light guide layer 16 is equal to or longer than T3. In the light emitting device 2, the light emitted from the first light emitting element 15 is emitted to the outer edge of the upper surface of the light guide layer 14 contacted with an inner edge of the reflector 13, which prevents only light emitted from the phosphor contained in the phosphor layer 17 from being emitted to the outer edge of the upper surface of the light guide layer 16, and therefore the yellow ring does not occur. Further, in the light emitting device 2, when the thickness T between the upper surfaces of the first light emitting elements 15 and the upper surface of the light guide layer 16 is equal to or shorter than T4, the thickness of the light guide layer 16 may be prevented from being thicker, and therefore the luminous efficiency may be prevented from being lower, and an increase of the manufacturing cost may be suppressed.

(Configuration and Function of the Light Emitting Device According to the First Embodiment)

Figure 2:
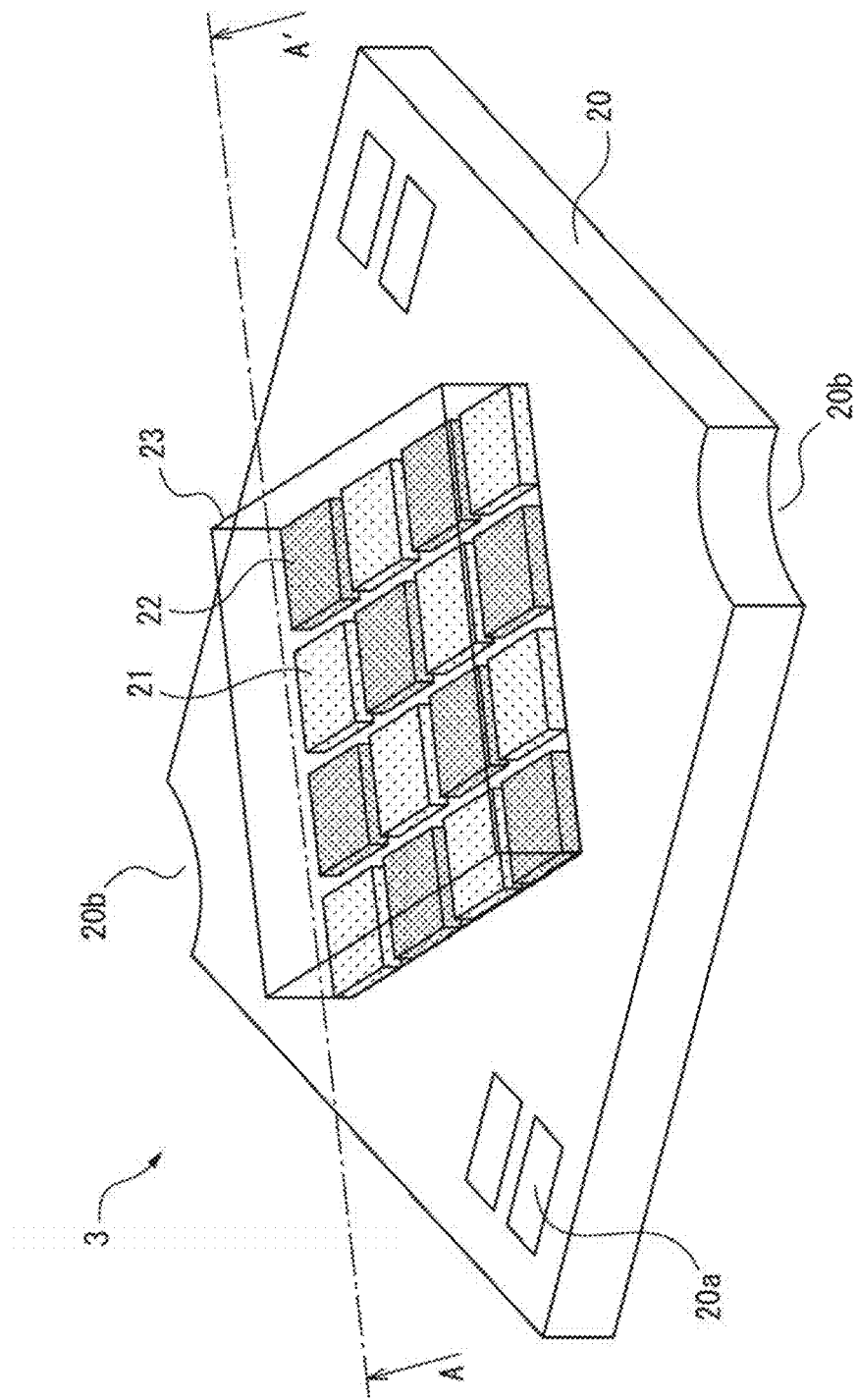
FIG. 2 is a perspective view of a light emitting device according to the first embodiment.
Figure 3:
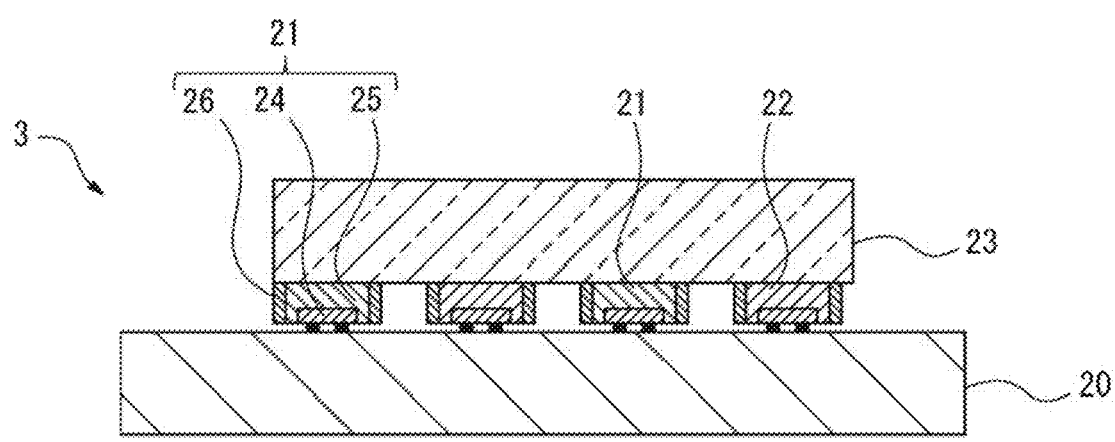
FIG. 3 is a cross-sectional view along a line A-A' in FIG. 1.

FIG. 2 is a perspective view of a light emitting device according to the first embodiment, and FIG. 3 is a cross-sectional view along a line A-A' in FIG. 2. A light emitting device 3 includes a substrate 20, eight first light emitting elements 21 and eight second light emitting elements 22 mounted on the upper surface of the substrate 20, and a sheet-type light guide layer 23 arranged on the first and second light emitting elements 21 and 22. It is preferable that the upper surface of the sheet-type light guide layer 23 is flat. Since manufacturing methods for the light emitting device 3 are well known, a detailed description thereof will be omitted.

The substrate 20 is an insulating substrate having a high reflectivity and thermal conductivity such as a ceramics or aluminum base substrate, power supply electrodes 20a are formed near one pair of corners, cuttings 20b for screwing are formed in the other pair of corners. The first and second light emitting elements 21 and 22 are arranged in a matrix of 4×4 on the upper surface of the substrate 20. Further, the first and second light emitting elements 21 and 22 are arranged in a checkerboard pattern. The light guide layer 23 is formed of a silicone resin, and is arranged so as to cover the first and second light emitting elements 21 and 22. The light guide layer 23 contains no diffusion materials referred to as fillers. In FIG. 2, wires connecting among the power supply electrodes 20*a*, and the first and second light emitting elements 21 and 22 are omitted.

Each of the first and second light emitting elements 21 and 22 has a rectangular planar shape of 1.7 mm×1.7 mm, and includes an LED die 24, a fluorescent resin 25 and a reflection frame 26. The LED dies 24 and the fluorescent resins 25 included in the first light emitting elements 21 are also referred to as first LED dies and first fluorescent resins, and the LED dies 24 and the fluorescent resins 25 included in the second light emitting elements 22 are also referred to as second LED dies and second fluorescent resins. Each of the LED dies 24 is a blue light emitting diode having a rectangular planar shape of 1.0 mm×1.0 mm, and includes a sapphire substrate arranged in an upper portion of the LED die, a light emitting layer formed below the sapphire substrate, and an anode and cathode electrodes arranged on the lower surface of the LED die. The dominant wavelength of blue light emitted from LED die 24 is between 445 nm and 495 nm, and, for example, is 450 nm. The fluorescent resin 25 is a silicone resin containing phosphor such as YAG, and coats the upper and side surfaces of the LED die 24, and wavelength-converts a portion of the light emitted from the LED dies 24. The reflection frame 26 is a silicone resin containing reflective fine particles such as titanium oxide, surrounds the fluorescent resin 25, and the light emitted from LED die 24 is directed upward by the reflection frame 26. The content of the phosphor contained in the fluorescent resin 25 of the first light emitting element 21 is different from that of the second light emitting element 22, the first light emitting element 21 emits light having a first wavelength, and the second light emitting element 22 emits light having a second wavelength different from the first wavelength. The light emitted from the first light emitting element 21 and having the first wavelength is cold light whose color temperature is, for example, 5000 K, and light emitted from the second light emitting element 22 and having a second wavelength is warm light whose color temperature is, for example, 2700 K.

The first and second light emitting elements 21 and 22 are flip-chip mounted on the upper surface of the substrate 20. The light guide layer 23 is adhered on the upper surfaces of the first and second light emitting elements 21 and 22 by adhesive materials.

Figure 4:
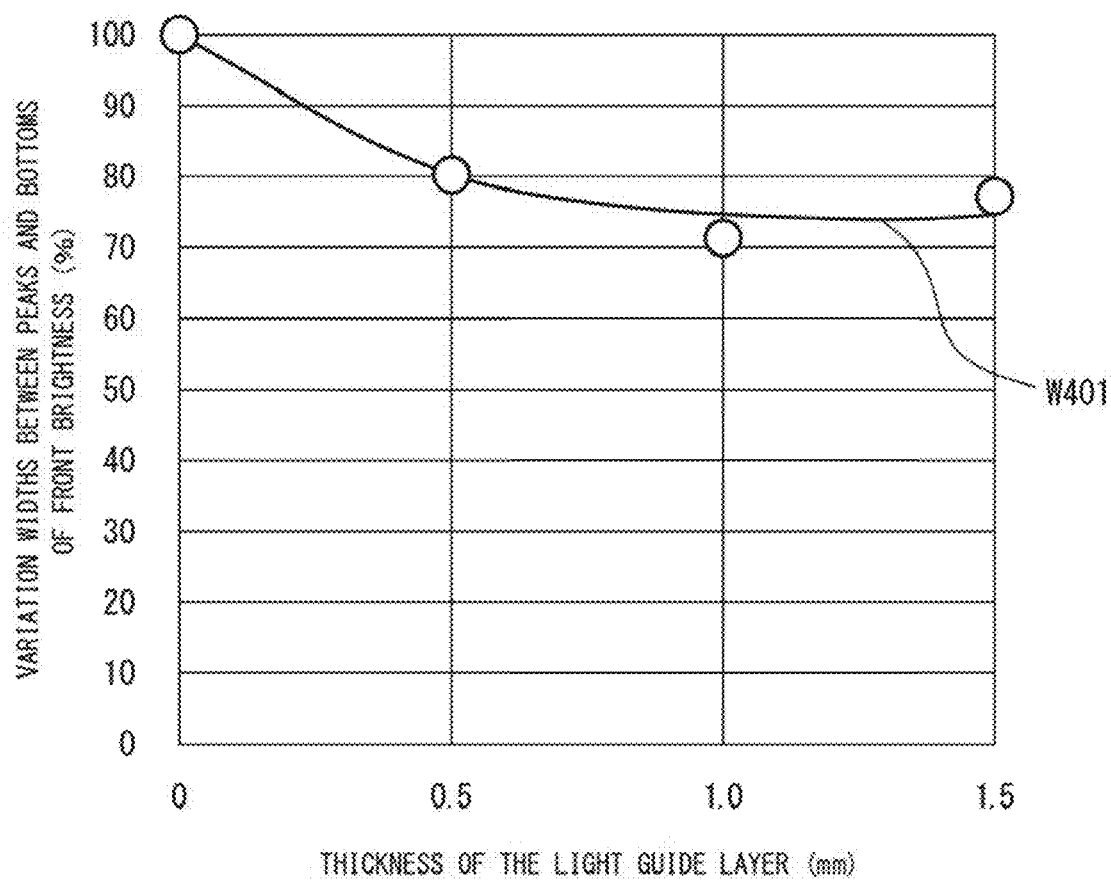
FIG. 4 is a diagram showing characteristics of the light emitting device shown FIG. 1.

FIG. 4 is a diagram showing a relationship between a front brightness of the light emitting device 3 and thicknesses of the light guide layer 23. The front brightness of the light emitting device 3 is measured along a line A-A' shown in FIG. 2, the brightness of the light emitted from the first light emitting elements 21 and the second light emitting element 22 is adjusted to be similar to each other.

A vertical axis of FIG. 4 indicates variation ranges of the peaks and bottoms of the front brightness, and the horizontal axis indicates the thickness (mm) of the light guide layer 23. The front brightness of the light emitted from the light emitting device 3 is maximized just above the first and second light emitting elements 21 and 22, and minimized at the midpoints between the first light emitting elements 21 and the second light emitting elements 22. In FIG. 4, a curve W401 indicates variation ranges which are the difference between the peak values (maximum values) of the front brightness and the bottom values (minimum values) thereof. The variation ranges of the front brightness indicated by the curve W401 are normalized, so that the variation value is 100% when the thickness of the light guide layer 23 is zero, i.e., the light guide layer 23 is not arranged.

The thicker the light guide layer 23 is, the lower the variation ranges of the front brightness of the light emitted from the first and second light emitting elements 21 and 22, and the variation is reduced when the thickness of the light guide layer 23 is over 1 mm.

Figure 5:
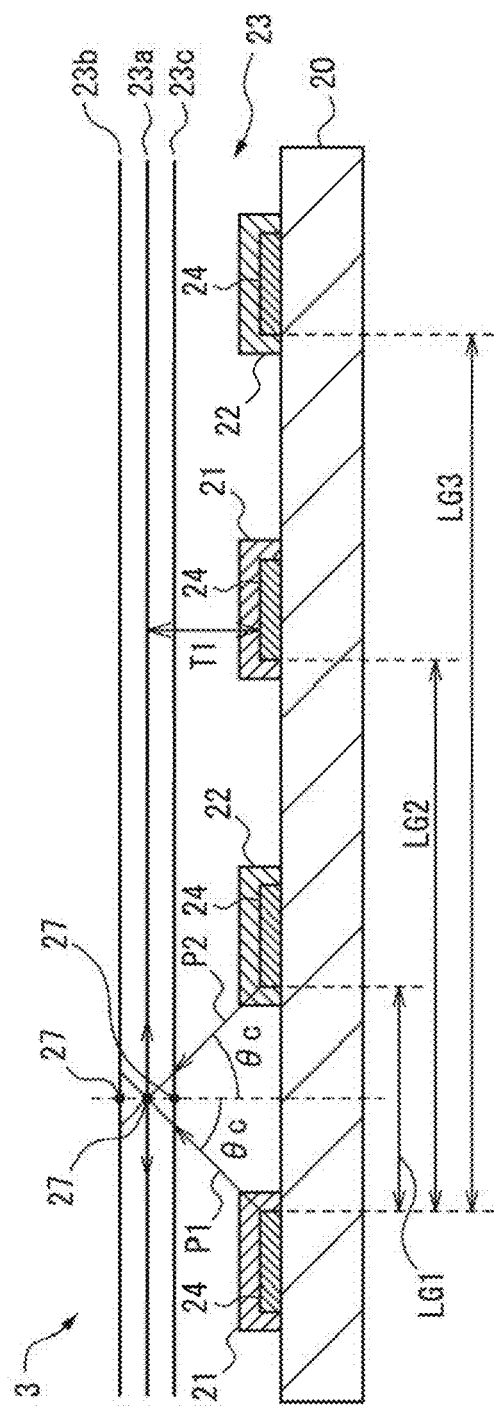
FIG. 5 is a diagram for explaining the thickness of a light guide layer shown in FIG. 2 (Part 1)

FIG. 5 is an explanatory view of an example of a lower limit value of the thickness between the upper surfaces of the LED dies 24 of the first and second light emitting elements 21 and 22 and the upper surface of the light guide layer 23, and is a cross-sectional view of the light emitting device 3 along the line A-A' shown in FIG. 2. FIG. 5 is exaggeratingly illustrated so that the distances between the first light emitting elements 21 and the second light emitting elements 22 are increased. In FIG. 5, positions of the upper surfaces of the light guide layer 23 are indicated as a first position 23*a*, a second position 23*b* and a third position 23*c*. The first position 23*a* is a position of the upper surface of the light guide layer 23 when the thickness is a lower limit value, the second position 23*b* is a position of the upper surface of the light guide layer 23 when the thickness is greater than the lower limit value, and the third position 23*c* is a position of the upper surface of the light guide layer 23 when the thickness is less than the lower limit value.

A distance between an LED die 24 of a first light emitting element 21 and an LED die 24 of a second light emitting element 22 adjacent to the first light emitting element 21 is LG1, a distance between LED dies 24 of adjacent first light emitting elements 21 is LG2, and a distance between an LED die 24 of a first light emitting element 21 and an LED die 24 of a second light emitting element 22 arranged through one first light emitting element 21 and one second light emitting element 22 is LG3. Light P1 is emitted from a side facing a second light emitting element 22 of a first light emitting element 21, and is incident on the upper surface of the light guide layer 23 at a critical angle θc. Light P2 is emitted from a side facing the first light emitting element 21 of the second light emitting element 22, and is incident on the upper surface of the light guide layer 23 at a critical angle θc.

A thickness between the upper surfaces of the LED dies 24 of the first and second light emitting elements 21 and 22 and the upper surface of the light guide layer 23 at the first position 23*a* is indicated by T1. When the critical angle θc of light emitted from the light guide layer 23 to the air and a distance LG1 between a first light emitting element 21 and a second light emitting element 22 are used, the thickness T1 between the upper surfaces of the LED dies 24 of the first and second light emitting elements 21 and 22 and the upper surface of the light guide layer 23 is indicated by $$T1 = LG1/(2\tan\theta c) \qquad (1)$$

When the thickness between the upper surfaces of the LED dies 24 of the first and second light emitting elements 21 and 22 and the upper surface of the light guide layer 23 is T1, the light P1 and the light P2 intersect at an intersection 27 at which a medium line between LED dies 24 of the first light emitting element 21 and the second light emitting element 22, and the upper surface of the light guide layer 23 intersect.

No dark lines are generated, when the position of the upper surface of the light guide layer 23 is the second position 23*b*, and the thickness between the upper surfaces of the LED dies 24 of the first and second light emitting elements 21 and 22 and the upper surface of the light guide layer 23 is thicker than T1. Light is emitted from the upper surface of the light guide layer 23 to the outside at the intersection 27, when the thickness between the upper surfaces of the LED dies 24 of the first and second light emitting elements 21 and 22 and the upper surface of the light guide layer 23 is thicker than T1. On the other hand, a dark portion having a band shape is generated, when the position of the upper surface of the light guide layer 23 is the third position 23c, and the thickness between the upper surfaces of the LED dies 24 of the first and second light emitting elements 21 and 22 and the upper surface of the light guide layer 23 is thinner than T1. Light is not emitted from the upper surface of the light guide layer 23 to the outside in the vicinity of the intersection 27, when the thickness between the upper surfaces of the LED dies 24 of the first and second light emitting elements 21 and 22 and the upper surface of the light guide layer 23 is thinner than T1.

Light is emitted from the entire upper surface of the light guide layer 23 and the uniformity of brightness of the light emitted from the light emitting device 3 is improved, when the thickness between the upper surfaces of the LED dies 24 of the first and second light emitting elements 21 and 22 and the upper surface of the light guide layer 23 is equal to or longer than T1. When the thickness between the upper surfaces of the LED dies 24 of the first and second light emitting elements 21 and 22 and the upper surface of the light guide layer 23 is equal to or longer than T1, the light having highly uniformity of brightness is emitted, and the brightness of the light emitted from a light fixture equipped with the light emitting device 3 is further uniformed, by combining a diffuser having a low diffusivity.

Figure 6:
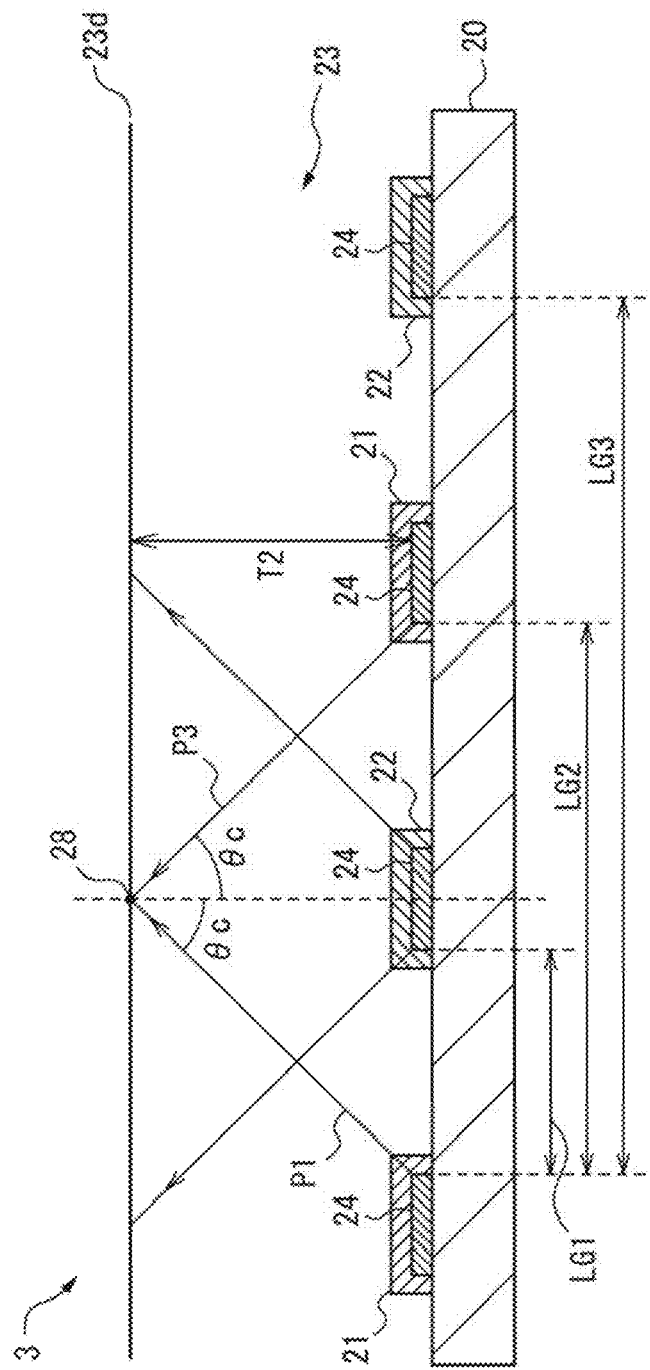
FIG. 6 is a diagram for explaining the thickness of a light guide layer shown in FIG. 2 (Part 2)

FIG. 6 is an explanatory diagram of an optimum value and an upper limit value of the thickness T between the upper surfaces of the LED dies 24 of the first and second light emitting elements 21 and 22 and the upper surface of the light guide layer 23, and is a cross-sectional view of the light emitting device 3 along the line A-A' shown in FIG. 2.

Light P1 is emitted from a side facing a second light emitting element 22 of an LED die 24 of a first light emitting element 21, and is incident on the upper surface of the light guide layer 23 at a critical angle θc. Light P3 is emitted from a side facing the second light emitting element 22 of an LED die 24 of a first light emitting element 21 adjacent to the LED die 24 of the first light emitting element 21 emitting light P1 arranged through the second light emitting element 22, and is incident on the upper surface of the light guide layer 23 at a critical angle θc. The light P1 and the light P3 intersect at the intersection 28 of the upper surface of the light guide layer 23, when the position of the upper surface of the light guide layer 23 is a fourth position 23d, and the thickness between the upper surfaces of the LED dies 24 of the first and second light emitting elements 21 and 22 and the upper surface of the light guide layer 23 is T2.

When the critical angle θc of light emitted from the light guide layer 23 to the air, and the distance LG2 between LED dies 24 of adjacent first light emitting elements 21 arranged through a second light emitting element 22 are used, the thickness T2 between the upper surfaces of the LED dies 24 of the first and second light emitting elements 21 and 22 and the upper surface of the light guide layer 23 is indicated by $$T2 = LG2/(2\tan\theta c) \qquad (2)$$

In the light emitting device 3, light emitted from the second light emitting element 22 in the upward direction is emitted to the outside from the upper surface of the light guide layer 23 in the vicinity of the intersection 28 of the upper surface of the light guide layer 23. The light emitting device 3 uniformly emits light to the outside from the entire upper surface of the light guide layer 23.

The refractive index of the light guide layer 23 formed of a silicone resin is 1.4, and therefore the critical angle θc is about 45°. Further, the distance LG1 between the LED dies 24 of the first and second light emitting elements 21 and 22 is 1.0 mm, and the distance LG2 between the LED dies 24 of the first light emitting elements 21 is 3.0 mm. When the critical angle θc is 45°, the distance LG1 is 1.0 mm, and the distance LG2 is 3.0 mm, T1 calculated by the equation (1) is 0.5 mm. Further, T2 calculated by the equation (2) is 1.5 mm. When the thickness T of the light guide layer 23 exceeds 1 mm, the amount of change, i.e., the attenuation amount is reduced, and therefore the curve W401 is saturated. The variation range of the front brightness corresponding to the curve W401 is saturated, when the thickness T between the upper surfaces of the LED dies 24 of the first and second light emitting elements 21 and 22 and the upper surface of the light guide layer 23 is at two-thirds of T2.

When the thickness between the upper surfaces of the LED dies 24 of the first and second light emitting elements 21 and 22 and the upper surface of the light guide layer 23 is 0.5 mm, i.e., T1, the value of the curved line W401 is about 80%. When the thickness between the upper surfaces of the LED dies 24 of the first and second light emitting elements 21 and 22 and the upper surface of the light guide layer 23 is 1.5 mm, i.e., T2, the value of the curved line W401 is about 75%.

In the light emitting device 3, when the thickness T between the upper surfaces of the LED dies 24 of the first and second light emitting elements 21 and 22 and the upper surface of the light guide layer 23 is equal to or longer than T1, the uniformity of the brightness of the emitted light is improved. However, when the thickness T between the upper surfaces of the LED dies 24 of the first and second light emitting elements 21 and 22 and the upper surface of the light guide layer 23 is in the vicinity of T1, it is preferable to arrange a diffusion layer on the light guide layer 23, in order to further improve the uniformity of the brightness of the emitted light.

Further, when the thickness T of the light guide layer 23 is increased, the luminous efficiency and the handling property are lowered. On the other hand, when the thickness T between the upper surfaces of the LED dies 24 of the first and second light emitting elements 21 and 22 and the upper surface of the light guide layer 23 is equal to or longer than 1.0 mm, the variation range of the front brightness is saturated. An upper limit value of the thickness between the upper surfaces of the LED dies 24 of the first and second light emitting elements 21 and 22 and the upper surface of the light guide layer 23 may be T2'=LG3/(2 tan θc). In the light emitting device 3, the thickness between the upper surfaces of the LED dies 24 of the first and second light emitting elements 21 and 22 and the upper surface of the light guide layer 23 is preferably equal to or longer than T1 and equal to or shorter than T2'. Specifically, the thickness T between the upper surfaces of the LED dies 24 of the first and second light emitting elements 21 and 22 and the upper surface of the light guide layer 23 is preferably equal to or longer than 0.5 mm and equal to or shorter than 2.5 mm.

Since the light guide layer 23 is preferably thinner in order to suppress a decrease of the luminous efficiency, an optimum value of the thickness T between the upper surfaces of the LED dies 24 of the first and second light emitting elements 21 and 22 and the upper surface of the light guide layer 23 is T2. When the thickness between the upper surfaces of the LED dies 24 of the first and second light emitting elements 21 and 22 and the upper surface of the light guide layer 23 is 0.5 mm, the variation range of the front brightness from is reduced from about two-thirds of T2, and therefore the thickness T is preferably equal to or longer than two-thirds of T2 and equal to or shorter than T2'.

Referring to FIGS. 4 to 6, it is explained that the uniformity of the brightness is improved. However, the light emitting device 3 may emit light having an intermediate color between a color of the light emitted from the first light emitting elements 21 and a color of the light emitted from the second light emitting elements 22, by adjusting the relative intensity of light emitted from the first light emitting elements 21 and the second light emitting elements 22. It is desirable to improve color distribution, i.e., color mixing property of the light emitted from the first light emitting elements 21 and the second light emitting elements 22 on the upper surface of the light guide layer 23.

(Configuration and Function of the Light Emitting Device According to the Second Embodiment)

Figure 7:
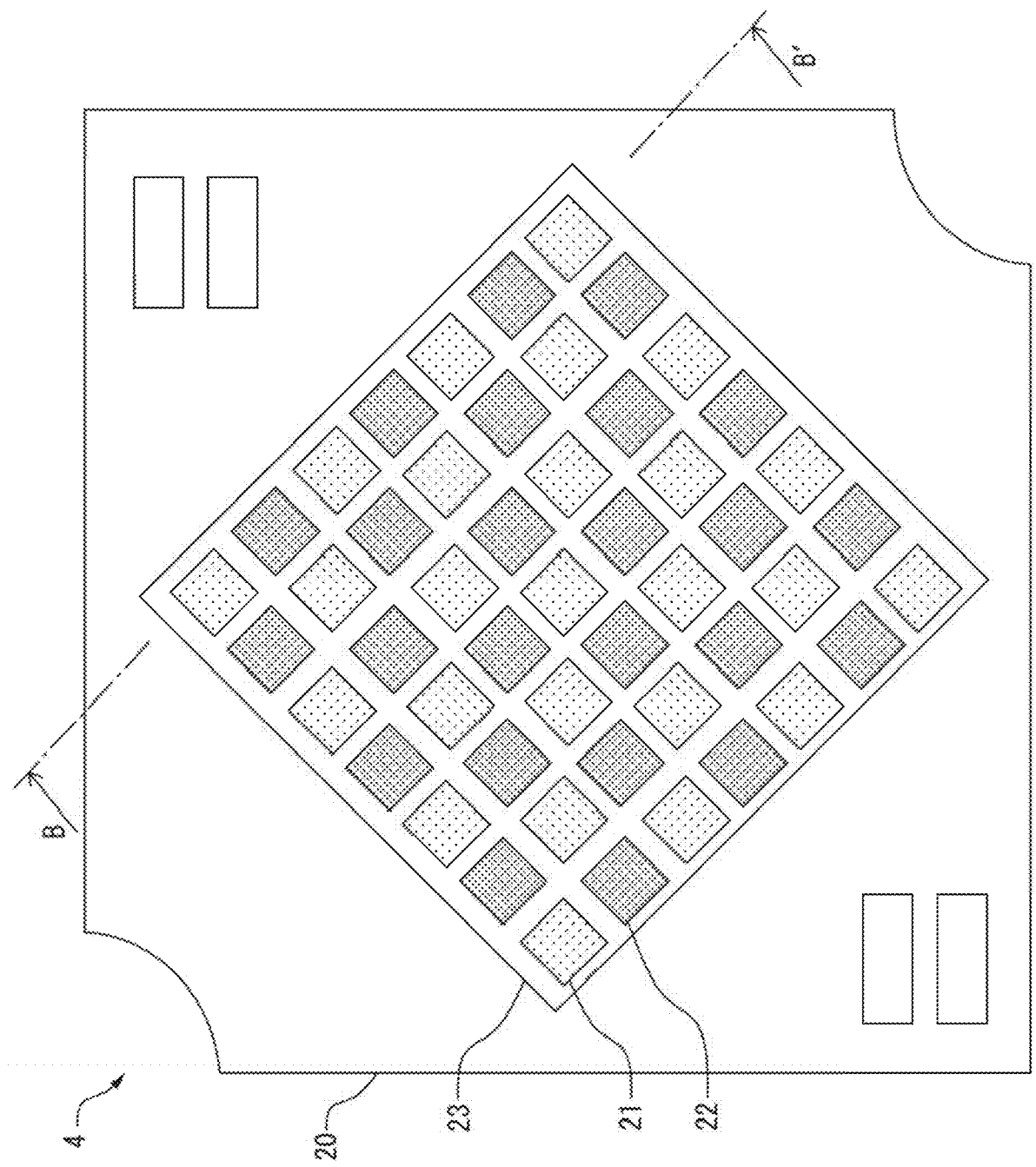
FIG. 7 is a plan view of a light emitting device according to the second embodiment.

FIG. 7 is a plan view of a light emitting device according to the second embodiment.

The number of the first and second light emitting elements 21 and 22 mounted on a light emitting device 4 is different from the number of the first and second light emitting elements 21 and 22 mounted on the light emitting device 3. Since the configuration and function of the light emitting device 4 except for the number of the first light emitting elements 21 and the second light emitting elements 22 are the same as those of the light emitting device 3, a detailed description thereof will be omitted.

The first light emitting elements 21 and the second light emitting elements 22 are arranged in a matrix of 7×7 on the upper surface of the substrate 20. The first light emitting elements 21 and the second light emitting elements 22 are arranged in a checkerboard pattern on the upper surface of the substrate 20.

Figure 8:
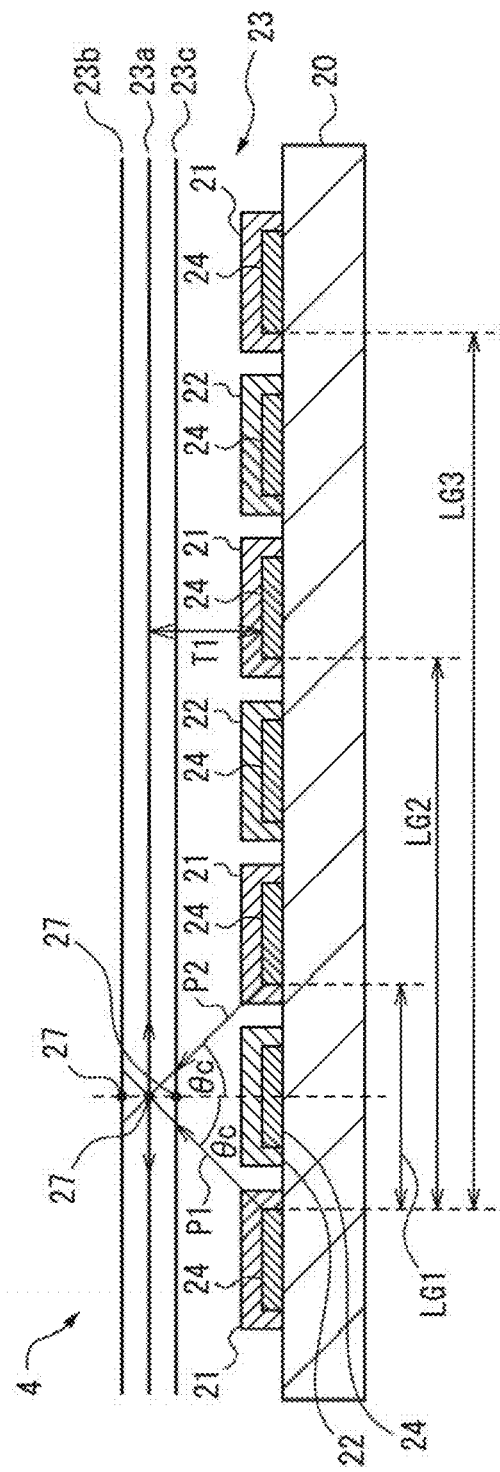
FIG. 8 is a diagram for explaining the thickness of a light guide layer shown in FIG. 7 (Part 1)

FIG. 8 is an explanatory view of the lower limit value of the thickness T between the upper surfaces of the LED dies 24 of the first and second light emitting elements 21 and 22 and the upper surface of the light guide layer 23, and is a cross-sectional view of the light emitting device 4 along a line B-B' in FIG. 8.

A distance between LED dies 24 of adjacent first light emitting elements 21 arranged through one second light emitting element 22 is LG1, and a distance between LED dies 24 of the two first light emitting elements 21 arranged through one first light emitting element 21 and two second light emitting elements 22 is LG2. Further, a distance between LED dies 24 of two first light emitting elements 21 arranged through two first light emitting elements 21 and three second light emitting elements 22 is LG3. Light P1 is emitted from a side facing a second light emitting element 22 of the LED die 24 of a first light emitting element 21, and is incident on the upper surface of the light guide layer 23 at a critical angle θc. Light P2 is emitted from a side of a first light emitting element 21 facing a second light emitting element 22 arranged at the side of the first light emitting element 21 emitting the light P1 arranged through the second light emitting element 22, and is incident on the upper surface of the light guide layer 23 at a critical angle θc.

A thickness between the upper surfaces of the LED dies 24 of the first and second light emitting elements 21 and 22 and the upper surface of the light guide layer 23 at the first position 23a is indicated by T1. The thickness T1 between the upper surfaces of the LED dies 24 of the first and second light emitting elements 21 and 22 and the upper surface of the light guide layer 23 has a relation indicated by the equation (1) with respect to the critical angle θc of light emitted from the light guide layer 23 into the air and the distance LG1 between LED dies 24 of adjacent first light emitting elements 21 through one second light emitting element 22.

When the position of the upper surface of the light guide layer 23 is the second position 23b, and the thickness between the upper surfaces of the LED dies 24 of the first and second light emitting elements 21 and 22 and the upper surface of the light guide layer 23 is equal to or longer than T1, the light emitted from the first light emitting elements 21 and the second light emitting elements 22 are color mixed over the entire upper surface of the light guide layer 23. When the position of the upper surface of the light guide layer 23 is the third position 23c, and the thickness between the upper surfaces of the LED dies 24 of the first and second light emitting elements 21 and 22 and the upper surface of the light guide layer 23 is thinner than T1, the light emitted from the first and second light emitting elements 21 and 22 are not color mixed in the vicinity of the intersection 27.

Figure 9:
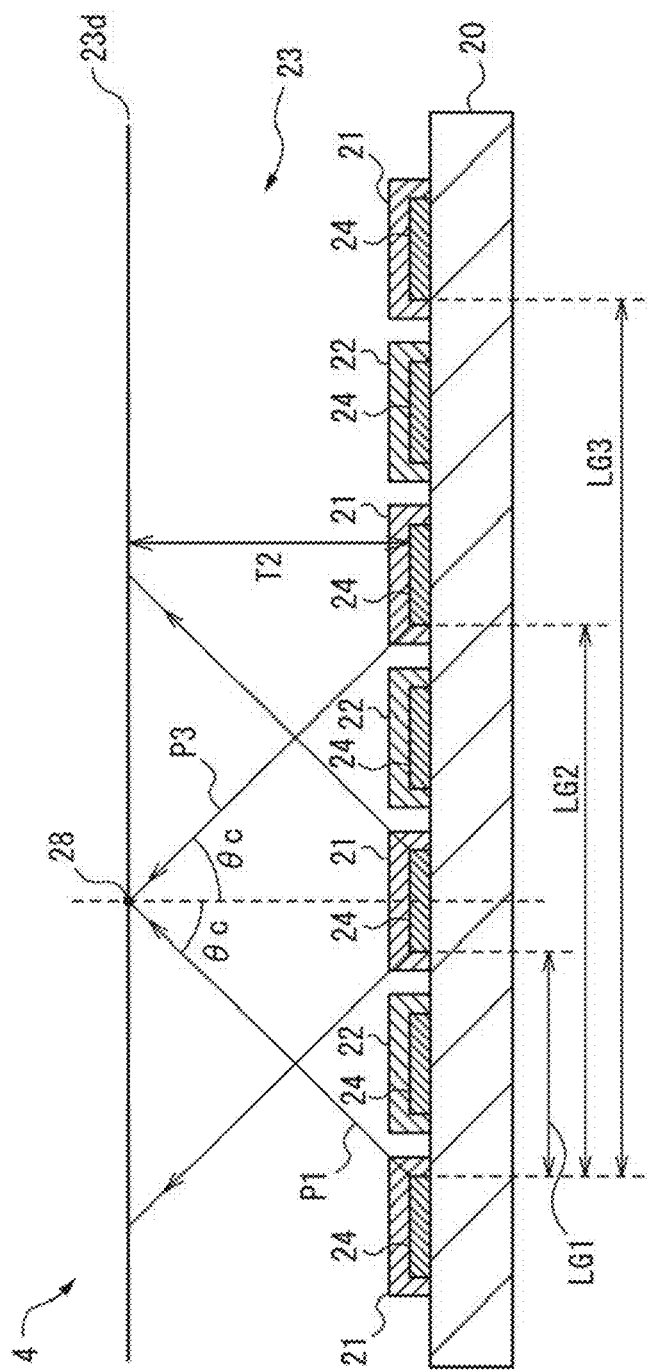
FIG. 9 is a diagram for explaining the thickness of a light guide layer shown in FIG. 7 (Part 1)

FIG. 9 is an explanatory diagram of an optimum value and the upper limit value of the thickness T between the upper surfaces of the LED dies 24 of the first and second light emitting elements 21 and 22 and the upper surface of the light guide layer 23, and is a cross-sectional view of the light emitting device 4 along the line B-B' shown in FIG. 7.

Light P1 is emitted from a side facing a second light emitting element 22 of an LED die 24 of a first light emitting element 21, and is incident on the upper surface of the light guide layer 23 at a critical angle θc. Light P3 is emitted from a side facing a second light emitting element 22 of an LED die 24 of a first light emitting element 21 adjacent to the LED die 24 of the first light emitting element 21 emitting light P1 arranged through one first light emitting element 22 and two second light emitting elements, and is incident on the upper surface of the light guide layer 23 at a critical angle θc. When the position of the upper surface of the light guide layer 23 is a fourth position 23d, and the thickness between the upper surfaces of the LED dies 24 of the first and second light emitting elements 21 and 22 and the upper surface of the light guide layer 23 is T2, the light P1 and the light P3 intersect at an intersection 28 of the upper surface of the light guide layer 23.

The thickness T2 between the upper surfaces of the LED dies 24 of the first and second light emitting elements 21 and 22 and the upper surface of the light guide layer 23 has a relation indicated by the equation (2) with respect to the critical angle θc of light emitted from the light guide layer 23 to the air, and a distance LG2 between LED dies 24 of adjacent first light emitting elements 21 through one first light emitting element 21 and the two second light emitting elements 22. Since it is preferable that the light guide layer 23 is thinner in order to suppress a decrease of the luminous efficiency, the optimum value of the thickness T between the upper surfaces of the LED dies 24 of the first and second light emitting elements 21 and 22 and the upper surface of the light guide layer 23 is T2.

When the thickness between the upper surfaces of the LED dies 24 of the first and second light emitting elements 21 and 22 and the upper surface of the light guide layer 23 is equal to or longer than T1 and equal to or shorter than T2, the light emitting device 4 may improve color mixing property of the light emitted from the first and second light emitting elements 21 and 22.

(Configuration and Function of the Light Emitting Device According to the Third Embodiment)

Figure 10:
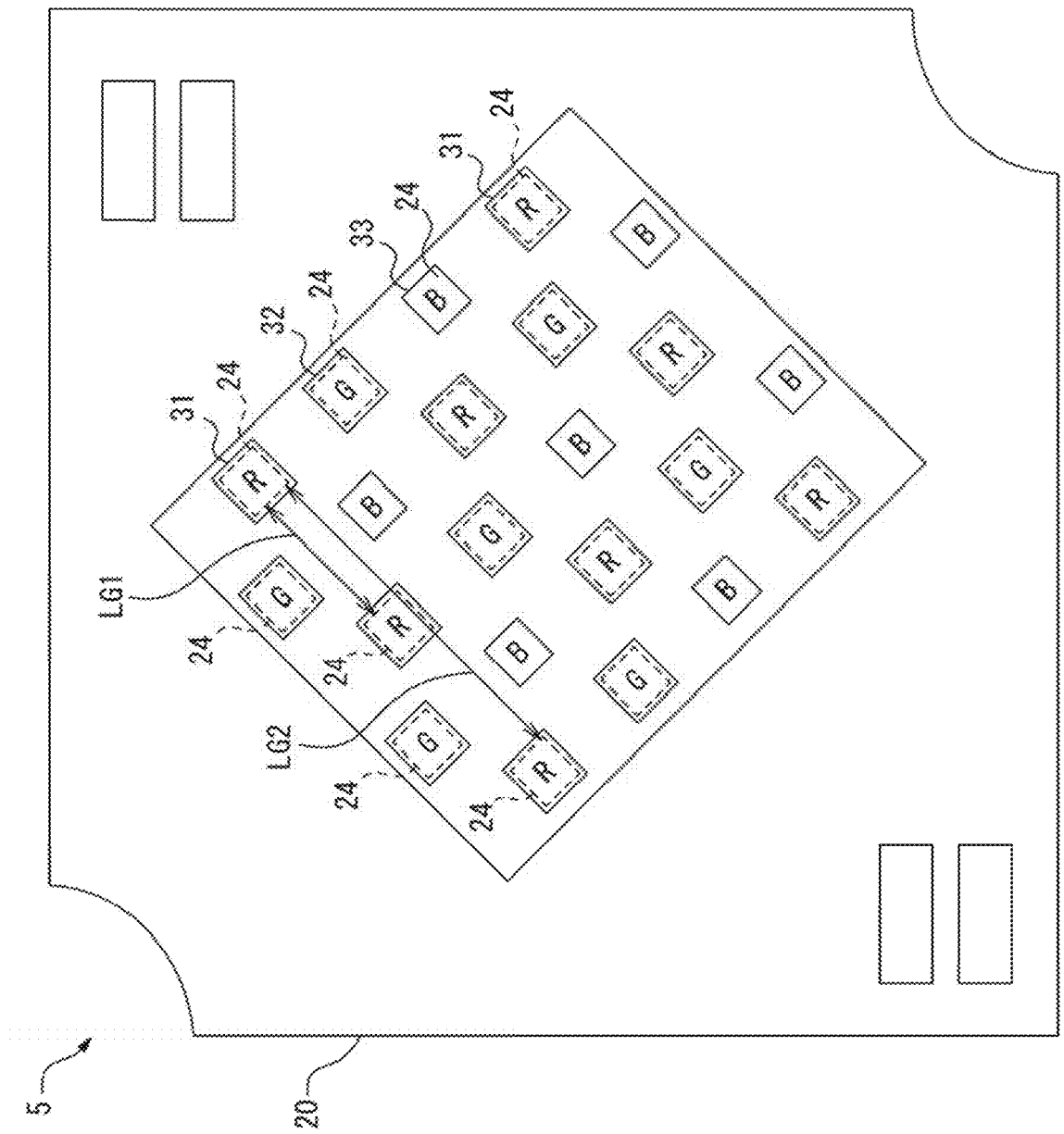
FIG. 10 is a plan view of a light emitting device according to the third embodiment.

FIG. 10 is a plan view of a light emitting device according to the third embodiment. A light emitting device 5 is different from the light emitting device 3 in that the light emitting device 5 includes first light emitting elements 31, second light emitting elements 32 and third light emitting elements 33 which are delta-arranged, and emit light having wavelengths corresponding to RGB colors, instead of the first light emitting elements 21 and second light emitting elements 22. Since configurations and functions of components in the light emitting device 5 except for the first light emitting elements 31, the second light emitting elements 32 and the third light emitting elements 33 are the same as those in the light emitting device 3 having the same reference numerals, a detailed description thereof will be omitted.

The first light emitting element 31 is formed of a blue LED die 24, and a silicone resin containing phosphor for emitting red light such as CASN and coating the blue LED die, and emits red light. The dominant wavelength of the red light emitted from the first light emitting element 31 is within a scope between 600 nm and 680 m, and is, for example, 660 nm. The second light emitting element 32 is formed of a blue LED die 24 and a silicone resin containing phosphor for emitting green light such as YAG and coating the blue LED die 24, and emits green light. The dominant wavelength of the green light emitted from the second light emitting element 32 is within a scope between 500 nm and 570 m, and is, for example, 550 nm. The third light emitting element 33 is formed of a blue LED die 24, and emits blue light. The dominant wavelength of the blue light emitted from the third light emitting element 33 is within a scope between 445 nm and 495 nm, and is, for example, 450 nm. The LED dies 24 included in the first light emitting elements 31 are also referred to as first LED dies, the LED dies 24 included in the second light emitting elements 32 are also referred to as second LED dies, and the LED dies 24 included in the third light emitting elements 33 are also referred to as third LED dies.

A distance between LED dies 24 of adjacent first light emitting elements 31 is LG1, a distance between LED dies 24 of first light emitting elements 31 arranged through one first light emitting element 31 is LG2. A thickness T between the upper surfaces of the LED dies 24 of the first, second and third light emitting elements 31 to 33 and the upper surface of the light guide layer 23 is equal to or longer than T1 calculated by the equation (1) from the distance LG1 between LED dies 24 of adjacent first light emitting elements 31. Further, the thickness T between the upper surfaces of the LED dies 24 of the first, second and third light emitting elements 31 to 33 and the upper surface of the light guide layer 23 is equal to or shorter than T2 calculated by the equation (2) from the distance LG2 between LED dies 24 of first light emitting elements 31 arranged through one first light emitting element 31. The thickness T may be equal to or longer than T1 calculated by the equation (1) from the shortest distance between LED dies 24 of adjacent first light emitting elements 31. The thickness T may be equal to or shorter than T2 calculated by the equation (2) from the longest distance between LED dies 24 of adjacent first light emitting elements 31.

The thickness T may be equal to or longer than T1 calculated by the equation (1) from the longest distance between LED dies 24 of adjacent first light emitting elements 31, adjacent second light emitting elements 32, or adjacent third light emitting elements 33. The thickness T may be equal to or shorter than T2 calculated by the equation (2) from the shortest distance between LED dies 24 of adjacent first light emitting elements 31, adjacent second light emitting elements 32, or adjacent third light emitting elements 33. The light emitting device 5 may further include a diffusion layer for diffusing light guided by the light guide layer 23, and arranged so as to cover the light guide layer 23.

(Configuration and Function of the Light Emitting Device According to the Fourth Embodiment)

Figure 11:
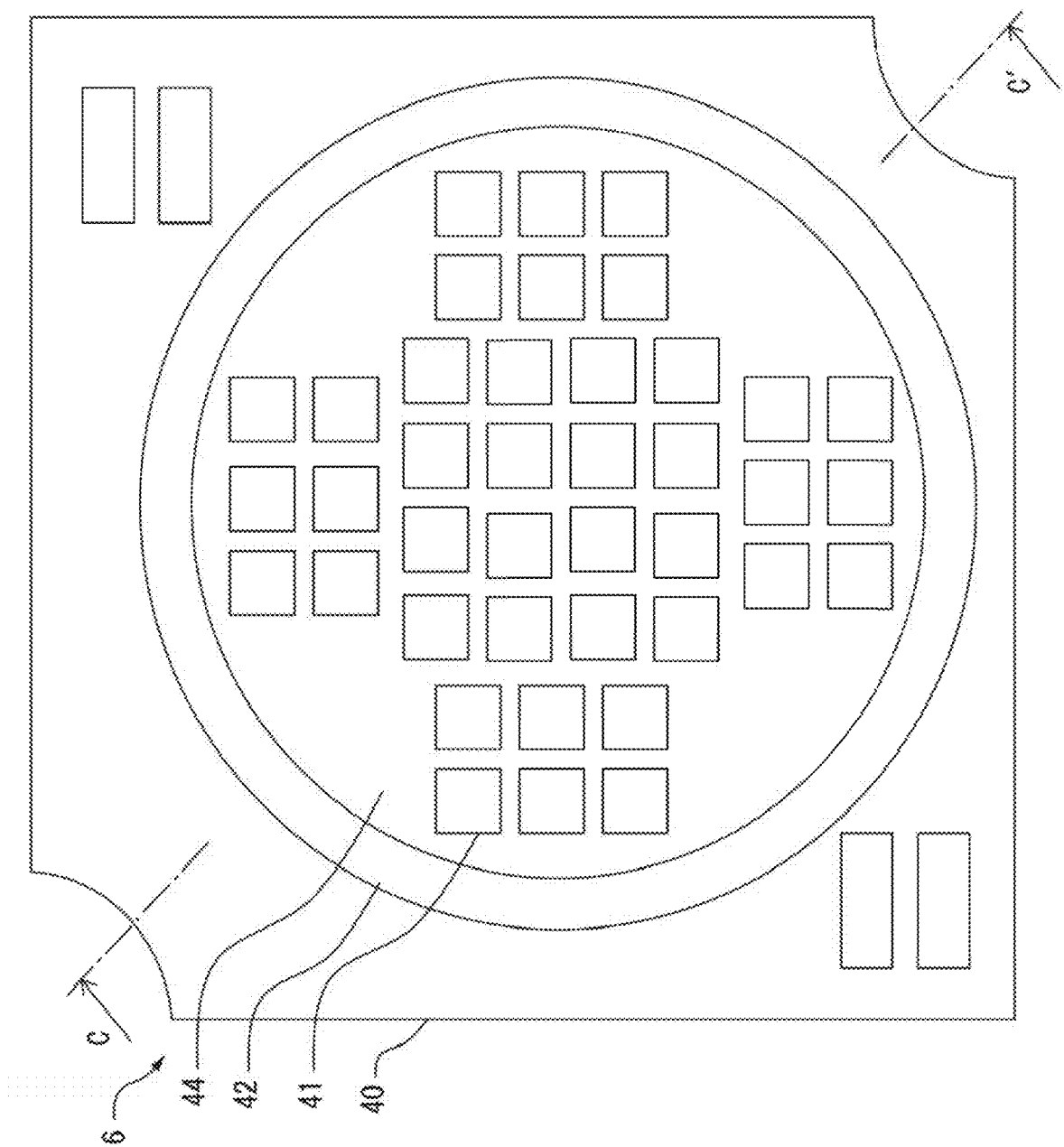
FIG. 11 is a plan view of a light emitting device according to the fourth embodiment.

FIG. 11 is a plan view of a light emitting device according to the fourth embodiment, FIG. 12A is a cross-sectional view of the light emitting device along C-C' shown in FIG. 11 (part 1), FIG. 12B is a cross-sectional view of the light emitting device along C-C' shown in FIG. 11 (part 2). The light emitting device 6 includes a substrate 40, first light emitting elements 41, a reflector 42, a light guide layer 43 and a diffusion layer 44. The substrate 40 has the same configuration and function as the substrate 20. The first light emitting element 41 is formed of a blue LED die, and emits blue light. The dominant wavelength of the blue light emitted from the first light emitting element 41 is within the scope between 445 nm and 495 nm, and is, for example, 450 nm. The reflector 42 is formed of a silicone resin containing white particles such as titanium oxide, and is arranged so as to surround the first light emitting element 41. The light guide layer 43 includes a phosphor layer 45 and a transparent layer 46. The phosphor layer 45 is a silicone resin containing phosphor such as YAG absorbing light emitted from the first light emitting element 41 and emitting yellow light. The transparent layer 46 is a silicone resin which transmits light emitted from the first light emitting elements 41 and the phosphor contained in the phosphor layer 45.

The diffusion layer 44 is a diffusion agent containing a filler in a silicone resin, a sheet containing diffusion particles, applied fine particle powder, prisms, etc., and preferably has more forward scattering and less backward scattering. The diffusion layer 44 may be a light transmitting plate subjected to emboss processing on the upper or lower surface. The diffusion layer 44 improves the uniformities of brightness and mixed color at the upper surface of the transparent layer 46. Further, since light is emitted from the entire upper surface of the diffusion layer 44, when the light emitting device 6 is attached to a lighting fixture, the diffusion degree of a diffusion member included in the lighting fixture may be reduced, and therefore a decrease of the luminous efficiency is suppressed. The diffusion layer 44 may be omitted.

The thickness T between the upper surfaces of the first light emitting elements 41 and the upper surface of the light guide layer 43 is equal to or longer than T1 calculated by the equation (1) from a distance between adjacent first light emitting elements 41. Further, the thickness T between the upper surfaces of the first light emitting elements 41 and the upper surface of the light guide layer 43 is equal to or shorter than T2 calculated by the equation (2) from a distance between two first light emitting elements 41 arranged through one first light emitting element 41.

A thickness Tk of the diffusion layer 44 is preferably longer than zero and is shorter than the thickness T between the upper surfaces of the first light emitting elements 41 and the upper surface of the light guide layer 43. It is further preferable that the thickness Tk of the diffusion layer 44 is 0.3 times longer than the thickness T between the upper surfaces of the first light emitting elements 41 and the upper surface of the light guide layer 43, and is 0.5 times shorter than the thickness T between the upper surfaces of the first light emitting elements 41 and the upper surface of the light guide layer 43.

When the thickness T between the upper surfaces of the first light emitting elements 41 and the upper surface of the light guide layer 43 is equal to or longer than 1.0 mm and equal to or shorter than 1.5 mm, and the thickness of the diffusion layer 44 is 0.5 mm, a variation range of the front brightness of the light from the first light emitting elements 41 is a good value of 40%. When the light guide layer 43 is not arranged and the thickness of the diffusion layer 44 is 1.25 mm, the total luminous flux of light from the first light emitting elements 41 is reduced by 7.5% as compared with the case where the diffusion layer 44 is not arranged. On the other hand, when the thickness of the light guide layer 43 is 1.25 mm and the thickness of the diffusion layer 44 is 0.5 mm, the total luminous flux of light from the first light emitting elements 41 is reduced by 3.9% as compared with the case where the diffusion layer 44 is not arranged, and reduction of the total luminous flux is suppressed as compared with the case where the light guide layer 43 is not arranged. When the thickness T between the upper surfaces of the first light emitting elements 41 and the upper surface of the light guide layer 43 is equal to or longer than 1.0 mm and equal to or shorter than 1.5 mm, and the thickness of the diffusion layer 44 is 0.5 mm, the thickness Tk of the diffusion layer 44 is included in a range between 0.3 times longer than the thickness T and 0.5 times shorter than the thickness T. When the thickness Tk of the diffusion layer 44 is included in the range between 0.3 times longer than the thickness T and 0.5 times shorter than the thickness T, a variation range of the front brightness of the light from the first light emitting elements 41 is reduced, and a decrease of the total luminous flux is suppressed.

A yellow ring is a phenomenon in which blue light emitted from the first light emitting elements 41 and yellow light emitted from the phosphor contained in the phosphor layer 45 are not mixed, and the yellow ring occurs in the vicinity of the inner wall of the reflector 42.

In FIG. 12A, a distance between a first light emitting element 41 adjacent to the reflector 42 and the reflector 42 is LB1, light P4 is emitted from a side facing the reflector 42 of the first light emitting element 41, and is incident on the upper surface of the light guide layer 23 at a critical angle θc. A minimum value T3 of the thickness T between the upper surfaces of the first light emitting elements 41 and the upper surface of the light guide layer 43 is indicated by $$T3 = LB1/\tan\theta c \tag{3}$$

The distance LB1 between a first light emitting element 41 adjacent to the reflector 42 and the reflector 42 is shorter than T tan θc. The distance LB1 is the smallest distance between first light emitting elements 41 and the reflector 42, in which portions of at least two sides of the first light emitting element 41 do not face other first light emitting elements 41.

Further, in FIG. 12B, a distance between a first light emitting element 41 arranged adjacent to the reflector 42 through one first light emitting element 41 and the reflector 42 is LB2, and light P5 is emitted from a side facing the reflector 42 of the first light emitting element 41 arranged adjacent to the reflector 42 through the one first light emitting element 41, and is incident on the upper surface of the light guide layer 23 at a critical angle θc. When the distance between the first light emitting element 41 arranged adjacent to the reflector 42 through the one first light emitting element 41 and the reflector 42 is LB2, the maximum value T4 of the thickness T between the upper surface of the first light emitting elements 41 and the upper surface of the light guide layer 43 is indicated by $$T4 = LB2/\tan\theta c \tag{4}$$

The distance LB2 between the first light emitting element 41 arranged adjacent to the reflector 42 through the one first light emitting element 41 and the reflector 42 is longer than T tan θc.

(Configuration and Function of the Light Emitting Device According to the Fifth Embodiment)

Figure 13B:
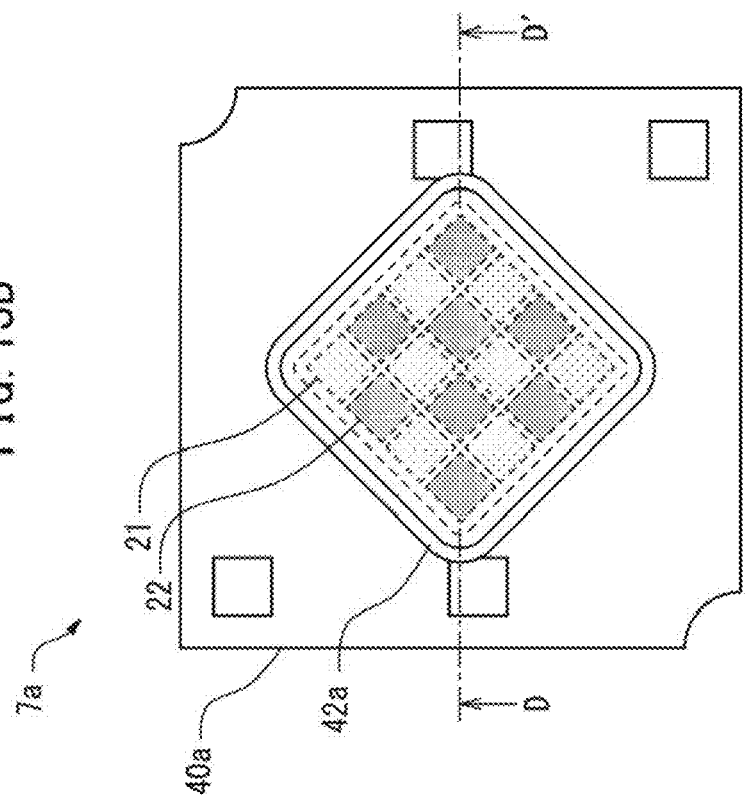
FIG. 13B is a plan view of the light emitting device shown in FIG. 13A.
Figure 13A:
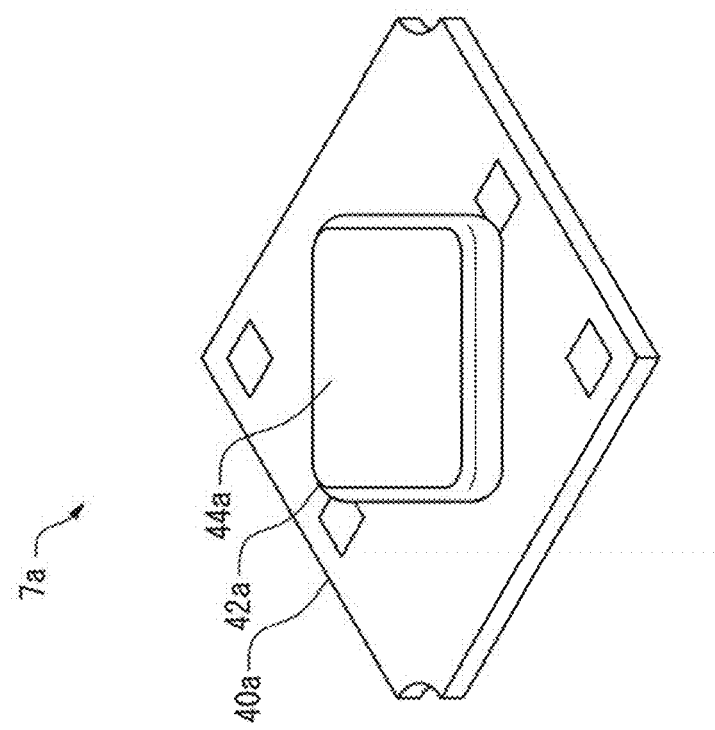
FIG. 13A is a perspective view of a light emitting device according to the fifth embodiment.
Figure 14:
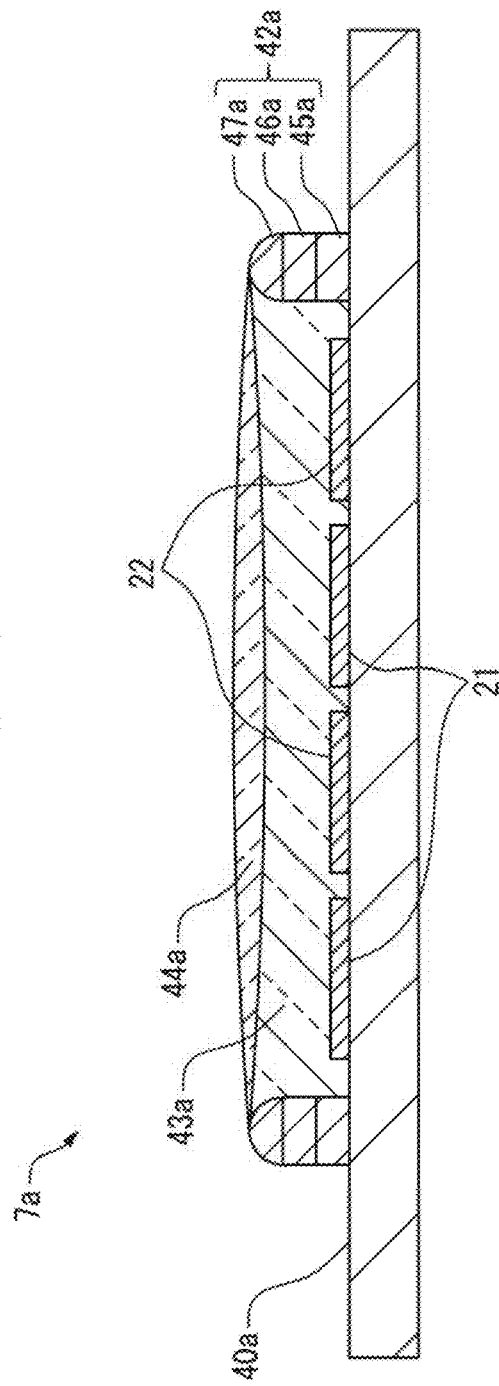
FIG. 14 is a cross-sectional view of the light emitting device along a line D-D' shown in FIG. 13B.

FIG. 13A is a perspective view of a light emitting device according to the fifth embodiment, FIG. 13B is a plan view of the light emitting device shown in FIG. 13A, and FIG. 14 is a cross-sectional view of the light emitting device along a line D-D' shown in FIG. 13B. The light emitting device 7a includes first light emitting elements 21, second light emitting elements 22, a substrate 40a, a reflector 42a, a light guide layer 43a, and a diffusion layer 44a. Since configurations and functions of the first and second light emitting elements 21 and 22 have been described with reference to FIGS. 2 and 3, a detailed description thereof will be omitted. The substrate 40a has the same configuration and function as the substrate 20.

The reflector 42a is formed of a silicone resin containing white particles such as titanium oxide, and is arranged so as to surround the first light emitting elements 41. The reflector 42a includes a plurality of layers being superposed. Specifically, the reflector 42a includes a first layer 45a, a second layer 46a, and a third layer 47a. The first layer 45a is a bottom layer, the second layer 46a is an intermediate layer, and the third layer 47a is a top layer. The third layer 47a, which is the top layer, has a substantially semicircular cross-sectional shape. Since the third layer 47a has a substantially semicircular cross-sectional shape, the reflector 42a has an upwardly bulging curved surface at an upper portion of its inner wall. The first layer 45a, the second layer 46a, and the third layer 47a are arranged so that their inner and outer walls extend upright. However, the reflector according to the embodiment may be composed of two or four or more layers. Further, one of the plurality of layers may be narrower than another of the plurality of layers arranged between the one of the plurality of layers and the substrate 40a. When one of the plurality of layers is narrower than another of the plurality of layers arranged between the one of the plurality of layers and the substrate 40a, light emitted from the first and second light emitting elements 21 and 22 may be efficiently emitted through the diffusion layer 44a.

Similarly to the light guide layer 23, the light guide layer 43a, which is also referred to as a first light transmitting layer, is formed of a silicone resin and arranged so as to cover the first and second light emitting elements 21 and 22, and does not contain diffusion materials referred to as fillers. The upper surface of the light guide layer 43a has an edge that is also referred to as a first contact part and that contacts the third layer 47a of the reflector 42a, and has a concave cross-sectional shape whose height decreases toward the center of a mounting region where the plurality of first light emitting elements is mounted.

The diffusion layer 44a, which is also referred to as a second light transmitting layer, is a silicone resin containing a diffusion material that diffuses light emitted from the first light emitting elements 41. The lower surface of the diffusion layer 44a is arranged so as to contact the upper surface of the light guide layer 43a, and has a concave cross-sectional shape whose height decreases from its edge toward the center of the mounting region where the plurality of first light emitting elements is mounted, similarly to the upper surface of the light guide layer 43a. The upper surface of the light guide layer 43a has an edge that is also referred to as a second contact part and that contacts the third layer 47a of the reflector 42a, and has a convex cross-sectional shape whose height increases toward the center of the mounting region where the plurality of first light emitting elements is mounted.

The diffusion material contained in the diffusion layer 44a is, for example, at least one of silica ($SiO_2$) and titanium oxide ($TiO_2$). When the diffusion material contained in the diffusion layer 44a is silica, the silica content is increased to raise the degree of diffusion because the difference in refractive index between silica and silicone resin is small; this increases the viscosity of the uncured raw material of the diffusion layer 44a, making coating less easy. When the diffusion material contained in the diffusion layer 44a is titanium oxide, a desired degree of diffusion may be achieved with a low titanium oxide content because the difference in refractive index between titanium oxide and silicone resin is large. When the diffusion material contained in the diffusion layer 44a is titanium oxide, a titanium oxide content is low; thus, when the distribution of titanium oxide is not uniform, the brightness and chromaticity of light emitted through the diffusion layer 44a may not be uniform. Further, when the titanium oxide content is high, the amount of returning light reflected by titanium oxide may increase, which decreases the luminous efficiency.

It is preferable that the diffusion material contained in the diffusion layer 44a include both silica and titanium oxide. Containing both silica and titanium oxide in the diffusion layer 44a as diffusion materials prevents the viscosity of the uncured raw material of the diffusion layer 44a from increasing, and enables the diffusion layer 44a to have a desired degree of diffusion.

The diffusion material contained in the diffusion layer 44a is not limited to silica and titanium oxide, and may include a first diffusion material having a predetermined refractive index and a second diffusion material that differs in refractive index and composition from the first diffusion material. Alternatively, three or more types of diffusion material that differ in composition may be contained in the diffusion layer 44a.

FIG. 15 is a diagram for explaining the relationship between contact parts where the upper surfaces of the light guide layer 43a and the diffusion layer 44a contact the reflector 42a and the shapes of the upper surfaces of an uncured resin of which the light guide layer 43a and the diffusion layer 44a are formed. FIG. 15A shows the relationship between the contact part where the upper surface of an uncured resin contacts the reflector 42a and the direction in which the uncured resin extends. FIG. 15B is the result of actual measurement showing the cross-sectional shape of the uncured resin for the case where the upper surface of the uncured resin contacts at a contact part C1 shown in FIG. 15A. FIG. 15C is the result of actual measurement showing the cross-sectional shape of the uncured resin for the case where the upper surface of the uncured resin contacts at a contact part C2 shown in FIG. 15A. FIG. 15D is the result of actual measurement showing the cross-sectional shape of the uncured resin for the case where the upper surface of the uncured resin contacts at a contact part C3 shown in FIG. 15A. FIG. 15E is the result of actual measurement showing the cross-sectional shape of the uncured resin for the case where the upper surface of the uncured resin contacts at a contact part C4 shown in FIG. 15A. In the results of actual measurement shown in FIGS. 15B to 15E, the contact angle of the uncured resin of which the light guide layer 43a and the diffusion layer 44a are formed with respect to the reflector 42a is 30°. Illustration of the cross-sectional shape of the uncured resin for the case where the upper surface of the uncured resin contacts at a contact part C5 shown in FIG. 15A is omitted.

When the upper surface of the uncured resin contacts at the contact part C1 where the inner wall of the reflector 42a extends vertically, the uncured resin extends from the contact part C1 in a direction L1 inclined with respect to the vertical direction by an angle corresponding to the contact angle. When the upper surface of the uncured resin contacts at the contact part C2 higher than the contact part C1 on the curved surface, the tangential direction at the contact part C2 inclines, and therefore the uncured resin extends from the contact part C1 in a direction L2 inclined by the contact angle and an angle corresponding to the tangential direction at the contact part C2. When the upper surface of the uncured resin contacts at the contact part C2, the direction in which the uncured resin extends is closer to the horizontal direction than when the upper surface of the uncured resin contacts at the contact part C1.

When the upper surface of the uncured resin contacts at the contact part C3, which is higher than the contact part C2 on the curved surface, the tangential direction at the contact part C3 further inclines, and therefore the uncured resin extends in a direction L3 that is closer to the horizontal direction than when the uncured resin extends from the contact part C2. When the upper surface of the uncured resin contacts at the contact part C4, which is higher than the contact part C3 in a top part of the curved surface, the uncured resin extends in a direction L4 above the horizontal direction.

Figure 15A:
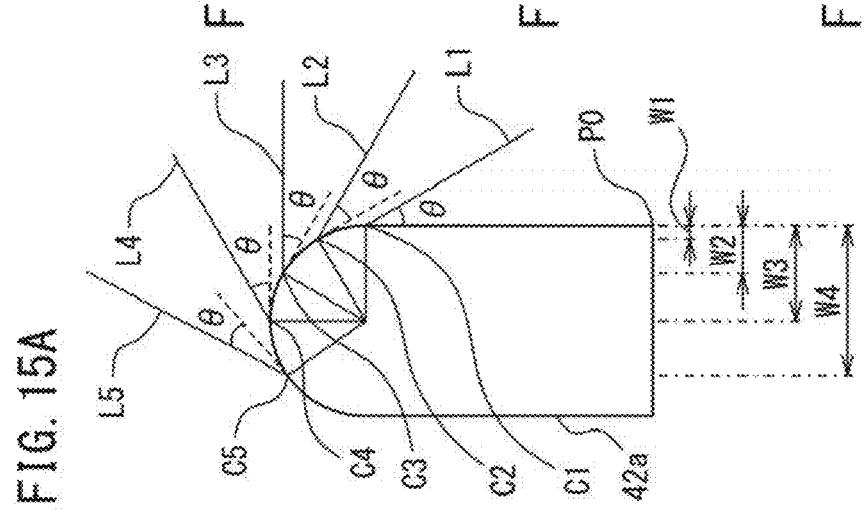
FIG. 15A shows the relationship between the contact part where the upper surface of an uncured resin contacts the reflector and the direction in which the uncured resin extends.
Figure 15B:
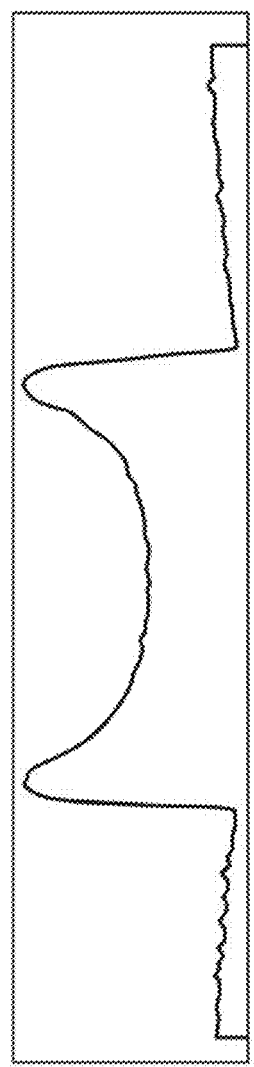
FIG. 15B is the result of actual measurement showing the cross-sectional shape of the uncured resin for the case where the upper surface of the uncured resin contacts at a contact part C1 shown in FIG. 15A.
Figure 15C:
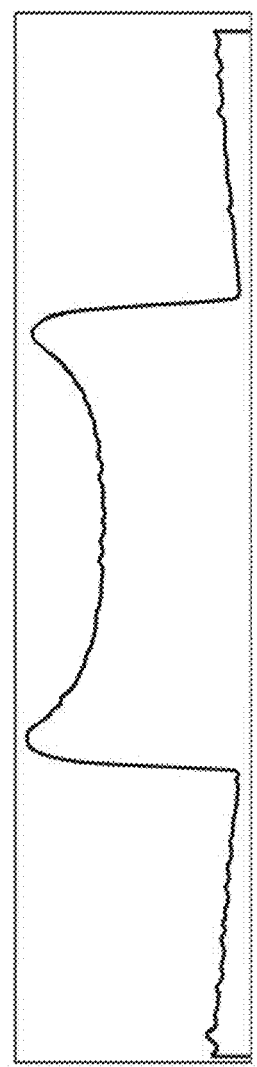
FIG. 15C is the result of actual measurement showing the cross-sectional shape of the uncured resin for the case where the upper surface of the uncured resin contacts at a contact part C2 shown in FIG. 15A.
Figure 15D:
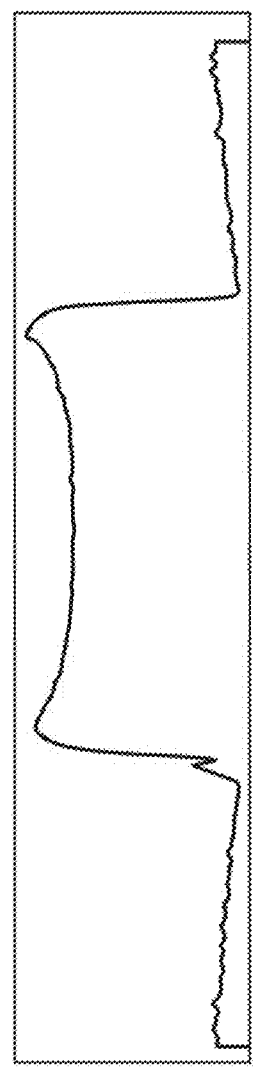
FIG. 15D is the result of actual measurement showing the cross-sectional shape of the uncured resin for the case where the upper surface of the uncured resin contacts at a contact part C3 shown in FIG. 15A.
Figure 15E:
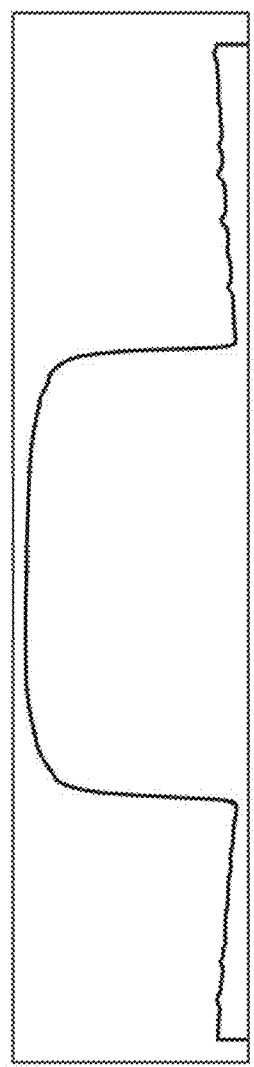
FIG. 15E is the result of actual measurement showing the cross-sectional shape of the uncured resin for the case where the upper surface of the uncured resin contacts at a contact part C4 shown in FIG. 15A.

When the contact part of the uncured resin contacts the upwardly bulging curved surface, an increase in height of the contact part causes the direction in which the uncured resin extends to approach from the vertically downward direction via the horizontal direction to the vertically upward direction. Making the contact part of the resin of the diffusion layer 44a higher than the contact part of the resin of the light guide layer 43a enables the upper surfaces of the light guide layer 43a and the diffusion layer 44a to extend in different directions. When the upper surfaces of the light guide layer 43a and the diffusion layer 44a extend in different directions, the thickness of the light guide layer 43a increases with the distance from the second contact part. The thickness of the light guide layer 43a at the center of the mounting region where the first and second light emitting elements 21 and 22 are mounted increases with the distance from the second contact part, and may therefore be greater than the thickness of the light guide layer 43a at the contact part where the upper surface contacts the reflector 42a. Further, a center portion of the uncured resin for the case where the upper surface of the uncured resin contacts at the contact part C5 shown in FIG. 15A is thicker than the center portion in FIG. 15E showing the cross-sectional shape of the uncured resin for the case where the upper surface of the uncured resin contacts at the contact part C4 shown in FIG. 15A.

Each of the contact parts C1 to C4 is an example of the first contact part where the top of the light guide layer 43a contacts the reflector 42a. Each of the contact parts C2 to C5 is an example of the second contact part where the top of the diffusion layer 44a contacts the curved surface of the reflector 42a. When the contact part C1 is the first contact part where the top of the light guide layer 43a contacts the reflector 42a, the horizontal distance between the contact part C1, which is the first contact part where the top of the light guide layer 43a contacts the reflector 42a, and the bottom P0 of the inner wall of the reflector 42a is "zero." The bottom P0 of the inner wall of the reflector 42a is a portion where the inner wall of the reflector 42a contacts the substrate 40a. When the contact part C2 is the second contact part where the top of the diffusion layer 44a contacts the curved surface of the reflector 42a, the horizontal distance between the contact part C2, which is the second contact part where the top of the diffusion layer 44a contacts the curved surface of the reflector 42a, and the bottom P0 of the inner wall of the reflector 42a is W1. The horizontal distance W1 between the contact part C2, which is the second contact part, and the bottom P0 of the inner wall of the reflector 42a is greater than the horizontal distance "zero" between the contact part C1, which is the first contact part, and the bottom P0 of the inner wall of the reflector 42a.

When one of the contact parts C1 and C2 is the first contact part where the top of the light guide layer 43a contacts the reflector 42a, the horizontal distances between the contact parts C1 and C2 and the bottom P0 of the inner wall of the reflector 42a are "zero" and W1. When the contact part C3 is the second contact part where the top of the diffusion layer 44a contacts the curved surface of the reflector 42a, the horizontal distance between the contact part C3 and the bottom P0 of the inner wall of the reflector 42a is W2. The horizontal distance W2 between the contact part C3, which is the second contact part, and the bottom P0 of the inner wall of the reflector 42a is greater than the horizontal distances "zero" and W1 between the contact parts C1 and C2, which are the first contact part, and the bottom P0 of the inner wall of the reflector 42a.

When one of the contact parts C1 to C3 is the first contact part where the top of the light guide layer 43a contacts the reflector 42a, the horizontal distances between the contact parts C1 to C3 and the bottom P0 of the inner wall of the reflector 42a are "zero," W1, and W2. When the contact part C4 is the second contact part where the top of the diffusion layer 44a contacts the curved surface of the reflector 42a, the horizontal distance between the contact part C4 and the bottom P0 of the inner wall of the reflector 42a is W3. The horizontal distance W3 between the contact part C4, which is the second contact part, and the bottom P0 of the inner wall of the reflector 42a is greater than the horizontal distances "zero," W1, and W2 between the contact parts C1 to C3, which are the first contact part, and the bottom P0 of the inner wall of the reflector 42a.

When one of the contact parts C1 to C4 is the first contact part where the top of the light guide layer 43a contacts the reflector 42a, the horizontal distances between the contact parts C1 and C2 and the bottom P0 of the inner wall of the reflector 42a are "zero," W1, W2, and W3. When the contact part C5 is the second contact part where the top of the diffusion layer 44a contacts the curved surface of the reflector 42a, the horizontal distance between the contact part C5 and the bottom P0 of the inner wall of the reflector 42a is W4. The horizontal distance W4 between the contact part C5, which is the second contact part, and the bottom P0 of the inner wall of the reflector 42a is greater than the horizontal distances "zero," W1, W2, and W3 between the contact parts C1 to C4, which are the first contact part, and the bottom P0 of the inner wall of the reflector 42a.

Figure 16:
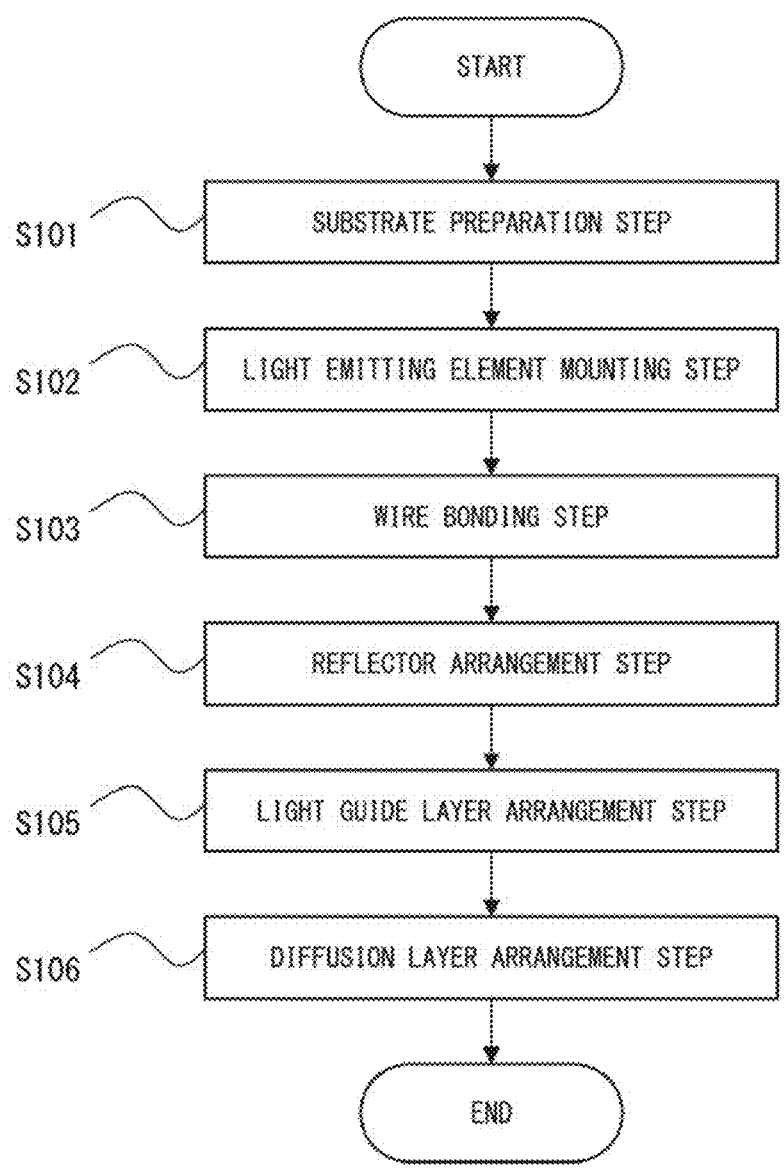
FIG. 16 is a flowchart showing a manufacturing method of the light emitting device shown in FIG. 14.

FIG. 16 is a flowchart showing a manufacturing method of the light emitting device 7a.

First, a substrate 40a is prepared in a substrate preparation step (S101). Then, in a light emitting element mounting step, first and second light emitting elements 21 and 22 are mounted on the substrate 40a (S102). Then, in a wire bonding step, the first and second light emitting elements 21 and 22 are electrically connected to two pairs of anode and cathode electrodes arranged on the substrate 40a through bonding wires (not shown) (S103).

Then, in a reflector arrangement step, a reflector 42a is arranged so as to surround the first and second light emitting elements 21 and 22 (S104). First, the uncured raw material of a first layer 45a is arranged, then the uncured raw material of a second layer 46a is arranged, and then the uncured raw material of a third layer 47a is arranged. The substrate 40a is then heated to cure the raw materials of the first layer 45a, the second layer 46a, and the third layer 47a, and thereby the reflector 42a is formed. In the light emitting device 7a, since the first contact part, which is the edge of the upper surface of the light guide layer 43a, contacts the reflector 42a at the third layer 47a, the uncured resin of the light guide layer 43a may be filled after lamination of the first layer 45a, the second layer 46a, and the third layer 47a.

Then, in a light guide layer arrangement step, a light guide layer 43a is arranged (S105). First, the uncured raw material of the light guide layer 43a is arranged. The substrate 40a is then heated to cure the raw material of the light guide layer 43a, and thereby the light guide layer 43a is formed.

In a diffusion layer arrangement step, a diffusion layer 44a is arranged (S106), and then the manufacturing process of the light emitting device 7a is finished. First, the uncured raw material of the diffusion layer 44a is applied by spraying to the light guide layer 43a. Application of the uncured raw material of the diffusion layer 44a by spraying forms the diffusion layer 44a even when the shape of the upper surface of the light guide layer 43a is any of a flat shape, an upwardly convex shape, or a downwardly concave shape.

Figure 17A:
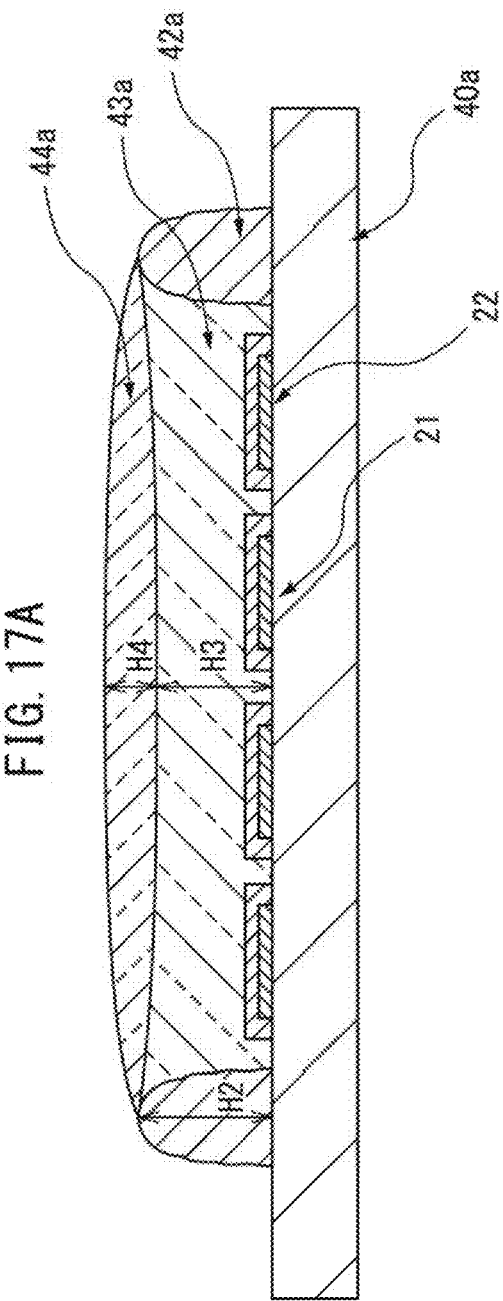
FIG. 17A is a cross-sectional view of a prototype of the light emitting device according to the fifth embodiment.
Figure 17C:
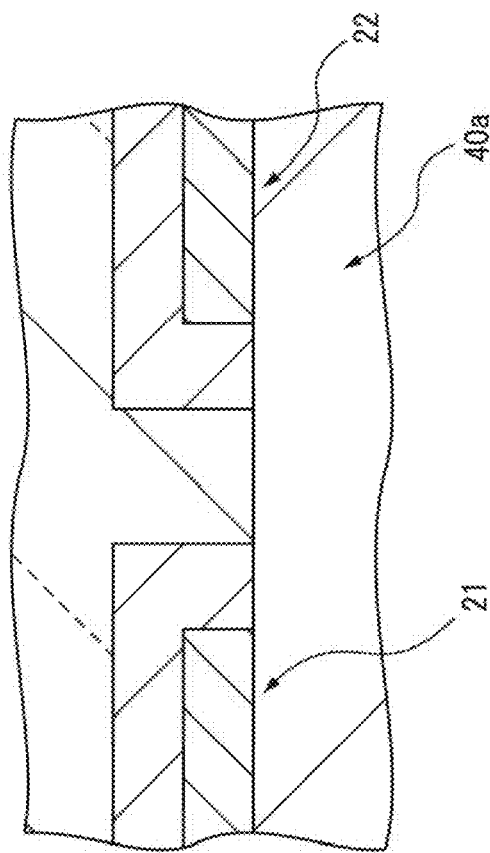
FIG. 17C is an enlarged cross-sectional view of a first light emitting element and a second light emitting element and their vicinity.
Figure 17B:
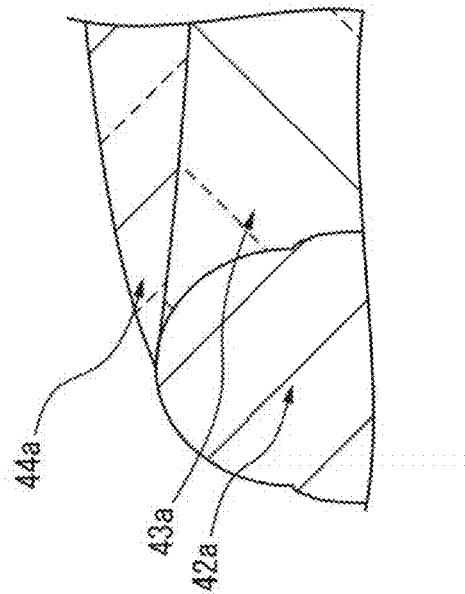
FIG. 17B is an enlarged cross-sectional view of an upper portion of the reflector and its vicinity.

FIG. 17A is a cross-sectional view of a prototype of the light emitting device 7a according to the fifth embodiment. FIG. 17B is an enlarged cross-sectional view of an upper portion of the reflector 42a and its vicinity, and FIG. 17C is an enlarged cross-sectional view of a first light emitting element 21 and a second light emitting element 22 and their vicinity.

In the prototype of the light emitting device 7a according to the fifth embodiment, the thickness T between the upper surfaces of the first light emitting elements 21 and a bottom part of the upper surface of the light guide layer 43a is equal to or greater than T1 calculated by equation (1) from the distance between adjacent first light emitting elements 21. Further, the thickness T between the upper surfaces of the second light emitting elements 22 and the bottom part of the upper surface of the light guide layer 43a is equal to or greater than T1 calculated by equation (1) from the distance between adjacent second light emitting elements 22. Further, the height H3 from the upper surface of the substrate 40a to the bottom part of the upper surface of the light guide layer 43a is less than the height H2 of the reflector 42a. Further, the height (H3+H4) from the upper surface of the substrate 40a to a top part of the upper surface of the diffusion layer 44a is greater than the height H2 of the reflector 42a.

In the prototype of the light emitting device 7a, the thickness T between the upper surfaces of the first light emitting elements 21 and the bottom part of the upper surface of the light guide layer 43a between a first light emitting element 21 and a second light emitting element 22 adjacent to the reflector 42a and the reflector 42a is greater than T3 calculated by equation (3). The distance LB1 in equation (3) is the distance between a first light emitting element 21 and a second light emitting element 22 adjacent to the reflector 42a and the reflector 42a.

In the light emitting device 7a, the thickness of the light guide layer 43a decreases with the distance from the first contact part. In the light emitting device 7a, since the thickness of the light guide layer 43a decreases with the distance from the first contact part, the light guide layer 43a at the center of the mounting region where the first and second light emitting elements 21 and 22 are mounted is thinner than the light guide layer 43a at the first contact part. In the light emitting device 7a, since the second contact part where the top of the diffusion layer 44a contacts the curved surface of the reflector 42a is higher than the first contact part where the top of the light guide layer 43a contacts the reflector 42a, the thickness of the diffusion layer 44a increases with the distance from the reflector 42a. Since the thickness of the diffusion layer 44a increases with the distance from the reflector 42a, the diffusion layer 44a is thickest in a center portion of the mounting region where the first and second light emitting elements 21 and 22 are dense. Further, the diffusion layer 44a is thinnest in the outer edge of the mounting region where the first and second light emitting elements 21 and 22 are sparse. Since the diffusion layer 44a is thick in the region where the light emitting elements are dense and thin in the region where the light emitting elements are sparse, the light emitting device 7a may improve the uniformity of brightness and chromaticity of emitted light.

Figure 18:
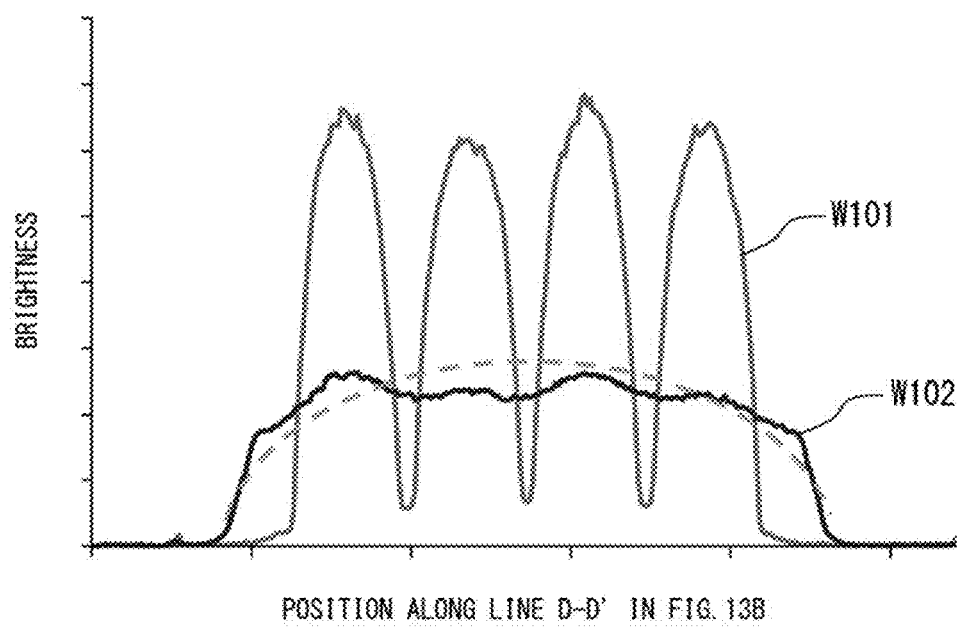
FIG. 18 is shows characteristics of brightness of light emitted from a light emitting device according to a comparative example and the light emitting device shown in FIG. 13.

FIG. 18 shows characteristics of brightness of light emitted from a light emitting device according to a comparative example and the light emitting device 7a. In FIG. 18, the horizontal axis indicates position inside the reflector 42a in the cross section along the line D-D' in FIG. 13B, and the vertical axis indicates brightness. W101 indicates characteristics of brightness of a light emitting device that includes a light guide layer with a flat upper surface and that does not include a diffusion layer, and W102 indicates characteristics of brightness of the light emitting device 7a.

In the light emitting device without a diffusion layer, brightness is high in a region where light emitting elements are arranged and low in a region where light emitting elements are not arranged, and the difference in brightness between the region where light emitting elements are arranged and the region where light emitting elements are not arranged is large. In the light emitting device 7a, the maximum of brightness is about one-third of brightness of the light emitting device without a diffusion layer, but the uniformity of brightness is improved.

In the light emitting device 7a, since the first contact part, which is the edge of the upper surface of the light guide layer 43a, contacts the reflector 42a at the third layer 47a, the uncured resin of the light guide layer 43a may be filled after lamination of the first layer 45a, the second layer 46a, and the third layer 47a. When the edge of the upper surface of the light guide layer 43a contacts the reflector 42a at the second layer 46a, the third layer 47a is arranged after formation of the light guide layer 43a, which enables the manufacturing process of the light emitting device 7a to be simplified.

(Configuration and Function of the Light Emitting Device According to the Sixth Embodiment)

FIG. 19A is a cross-sectional view of a light emitting device according to the sixth embodiment, and FIG. 19B is a diagram for explaining the structure of a reflector shown in FIG. 19A. FIG. 19A is a cross-sectional view corresponding to the cross-sectional view along the line D-D' shown in FIG. 13B.

The light emitting device 7b is different from the light emitting device 7a in that the light emitting device 7b includes a reflector 42b, a light guide layer 43b, and a diffusion layer 44b, instead of the reflector 42a, the light guide layer 43a, and the diffusion layer 44a. Since configurations and functions of components in the light emitting device 7b except for the reflector 42b, the light guide layer 43b, and the diffusion layer 44b are the same as those in the light emitting device 7a having the same reference numerals, a detailed description thereof will be omitted.

The reflector 42b is formed of a silicone resin containing white particles such as titanium oxide, and includes a first layer 45b, a second layer 46b, and a third layer 47b. The first layer 45b, the second layer 46b, and the third layer 47b each have a spherically curved surface as an upper surface, and are superposed in the order of the first layer 45b, the second layer 46b, and the third layer 47b. The third layer 47b is arranged so that the position of its apex viewed from above is outside the position of the apex of the second layer 46b. The first contact part, which is the edge of the light guide layer 43b, contacts the curved surface of the second layer 46b arranged below the third layer 47b, i.e., the top layer, and the second contact part, which is the edge of the diffusion layer 44b, contacts the curved surface of the third layer 47b.

The light guide layer 43b is also referred to as a first light transmitting layer, similarly to the light guide layer 43a, and is different from the light guide layer 43a in that the upper surface of the light guide layer 43b extends horizontally. The light guide layer 43b at the center of a mounting region where the first and second light emitting elements 21 and 22 are mounted is as thick as the light guide layer 43b at the first contact part. Since configurations and functions of the light guide layer 43b except for the direction in which the upper surface extends are the same as those of the light guide layer 43a, a detailed description thereof will be omitted.

The diffusion layer 44b is also referred to as a second light transmitting layer, similarly to the diffusion layer 44a, and is different from the diffusion layer 44a in that the upper surface of the diffusion layer 44b extends horizontally. Since configurations and functions of the diffusion layer 44b except for the direction in which the upper surface extends are the same as those of the diffusion layer 44a, a detailed description thereof will be omitted.

In the light guide layer 43b, the height of the first contact part, which is the outer edge of the light guide layer 43b, is adjusted so that the upper surface of the light guide layer 43b extends horizontally. In the diffusion layer 44b, the height of the second contact part, which is the outer edge of the diffusion layer 44b, is adjusted so that the upper surface of the diffusion layer 44b extends horizontally. Since the upper surfaces of both the light guide layer 43b and the diffusion layer 44b extend horizontally, the diffusion layer 44b at the center of the mounting region where the first and second light emitting elements 21 and 22 are mounted is as thick as the diffusion layer 44b at the first contact part.

(Light Emitting Device According to a Modification)

FIG. 20A is a cross-sectional view of a light emitting device according to a first modification, FIG. 20B is a cross-sectional view of a light emitting device according to a second modification, and FIG. 20C is a cross-sectional view of a light emitting device according to a third modification. FIG. 20D is a cross-sectional view of a light emitting device according to a fourth modification, FIG. 20E is a cross-sectional view of a light emitting device according to a fifth modification. FIGS. 20A to 20E are cross-sectional views corresponding to the cross-sectional view along the line A-A' shown in FIG. 2.

A light emitting device 8a according to the first modification is different from the light emitting device 3 in that the light emitting device 8a includes a reflector 50 and a light guide layer 51 instead of the light guide layer 23. Since configurations and functions of components in the light emitting device 8a except for the reflector 50 and the light guide layer 51 are the same as those in the light emitting device 3 having the same reference numerals, a detailed description thereof will be omitted.

Similarly to the reflector 42, the reflector 50 is formed of a silicone resin containing white particles such as titanium oxide, and is arranged so as to surround the first and second light emitting elements 21 and 22. The light guide layer 51 is a silicone resin filled in a region surrounded by the reflector 50, and transmits light emitted from the first and second light emitting elements 21 and 22. The light guide layer 51 is formed by heating the substrate 20 to cure uncured resin material, after the uncured resin material is filled in the region surrounded by the reflector 50. Since the light emitting device 8a includes the reflector 50, the light emitting device 8a may emit light having high directional characteristics from the upper surface of the light guide layer 51. Although the light emitting devices 3 to 5 do not include a reflector, the light emitting devices 3 to 5 may further include a reflector that is arranged on the substrate so as to surround the plurality of first light emitting elements and reflects light emitted from the first light emitting elements.

The light emitting device 8b according to the second modification is different from the light emitting device 8a in that the light emitting device 8b includes a diffusion layer 52. Since configurations and functions of components in the light emitting device 8b except for the diffusion layer 52 are the same as those in the light emitting device 8a having the same reference numerals, a detailed description thereof will be omitted.

Similarly to the diffusion layer 44, the diffusion layer 52 is a sheet containing diffusion particles, applied fine particle powder, a prism, etc., is connected to the light guide layer 51, by adhering the lower surface of the diffusion layer 52 to the upper surface of the light guide layer 51. The light emitting device 8b includes the diffusion layer 52, and therefore the light emitting device 8b may emit light having high uniformity of brightness and high color mixing property. Although the light emitting devices 3 to 5 do not include a diffusion layer, the light emitting devices 3 to 5 further include a diffusion layer for diffusing the light guided through the light guide layer, and arranged so as to cover the light guide layer.

A light emitting device 8c according to a third modification is different from the light emitting device 8b in that the light emitting device 8c includes a diffusion layer 53 instead of the diffusion layer 52. Since configurations and functions of components in the light emitting device 8c except for the diffusion layer 53 are the same as those in the light emitting device 8b having the same reference numerals, a detailed description thereof will be omitted.

The diffusion layer 53 is different from the diffusion layer 52 in that diffusers 53a are formed above the first and second light emitting elements 21 and 22. In the light emitting device 8c, the diffusers 53a are formed on regions above the first and second light emitting elements 21 and 22 where the light emitted from the first and second light emitting elements 21 and 22 has high brightness, and therefore the light emitting device 8c may efficiently mix light having high brightness, and emit light having high uniformity of brightness and high color mixing property while suppressing a decrease of the luminous efficiency.

A light emitting device 8d according to a fourth modification is different from the light emitting device 8b in that the light emitting device 8d includes a light guide layer 54 and a diffusion layer 55 instead of the light guide layer 51 and diffusion layer 52. Since configurations and functions of components in the light emitting device 8d except for the light guide layer 54 and the diffusion layer 55 are the same as those in the light emitting device 8b having the same reference numerals, the detailed description thereof will be omitted.

The light guide layer 54 is different from the light guide layer 51 in that the upper surface of the light guide layer 54 has a convexly curved shape. The diffusion layer 55 is different from the diffusion layer 53 in that the diffusion layer 55 has a convexly curved shape so as to protrude upward at the central portion in accordance with the upper surface shape of the light guide layer 54. Since the light guide layer 54 and diffusion layer 55 have curved lens shapes so as to protrude upward at the central portion, the light emitting device 8d may emit light having high directional characteristics.

A light emitting device 8e according to a fifth modification is different from the light emitting device 8a in that the light emitting device 8e includes a frame member 56 and an adhesive layer 57 instead of the reflector 50 and light guide layer 51. Since configurations and functions of components in the light emitting device 8e except for the frame member 56 and adhesive layer 57 are the same as those in the light emitting device 8a having the same reference numerals, and a detailed description thereof will be omitted.

The frame member 56 includes a diffusing frame 58, and a light guider 59. The diffusing frame 58 includes a side portion arranged so as to surround the first and second light emitting elements 21 and 22, and an upper portion covering the upper portion of the first and second light emitting elements 21 and 22, diffuses light emitted from the first and second light emitting elements 21 and 22, and emits the light to the outside. The side portion of the diffusion frame covering the side surface of the light guider 59 is thicker than that of the diffusers covering the upper surface of the light guider, and therefore functions as a reflection frame. The light guider 59 is formed of a member that transmits light emitted from the first and second light emitting elements 21 and 22 such as a silicone resin, and is integrated with the diffusing frame 58. The adhesive layer 57 is formed of a member for transmitting light emitted from the first and second light emitting elements 21 and 22 such as a silicone resin, and is an adhesive member for adhering the frame member 56 to the substrate 20.

In the light emitting device 8e, since the frame member 56 includes the diffusing frame 58 and light guider 59, no reflectors also referred to as dam materials are arranged, and therefore the manufacturing process thereof may be simplified. Further, in the light emitting device 8e, since the diffusing frame 58 and light guider 59 are integrated as the frame member 56, the light guider 59 having uniformly thickness may be easily formed. Further, in the light emitting device 8e, a diffusion layer having a desired diffusion degree may be easily formed, by adjusting the diffusion degree of the diffusing frame 58. Although the frame member 56 functions as a reflection frame by increasing the thickness of the side surface of the light guider 59, in the light emitting device according to the embodiment, a material having a high reflectivity may be arranged on the side surface of the light guider 59.

Figure 21E:
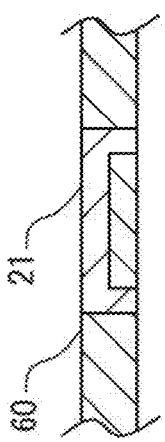
FIG. 21E is an enlarged view of a portion indicated by an arrow D in FIG. 14A.
Figure 21F:
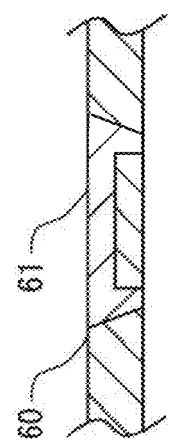
FIG. 21F is an enlarged view of a portion indicated by an arrow E in FIG. 14B.
Figure 21G:
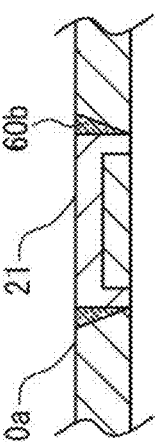
FIG. 21G is an enlarged view of a portion indicated by an arrow F in FIG. 14C.
Figure 21A:
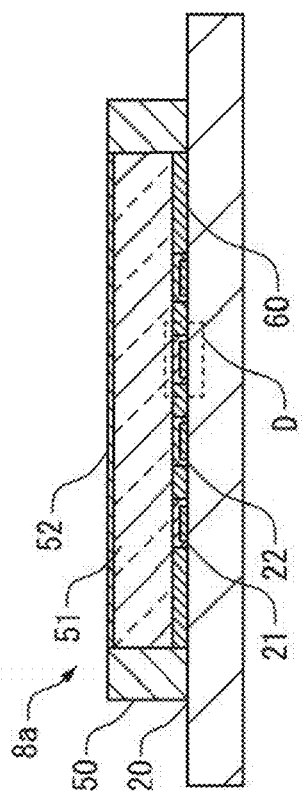
FIG. 21A is a cross-sectional view of a light emitting device according to a sixth modification.
Figure 21B:
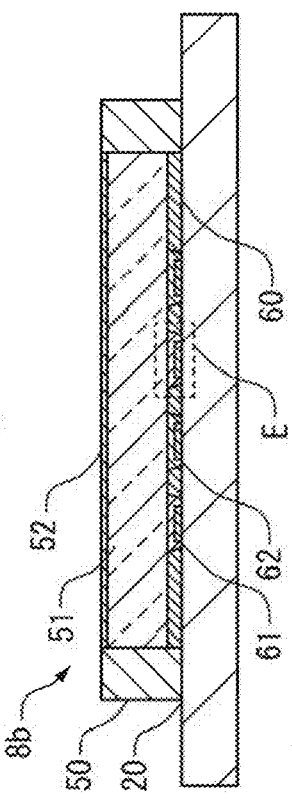
FIG. 21B is a cross-sectional view of a light emitting device according to a seventh modification.
Figure 21C:
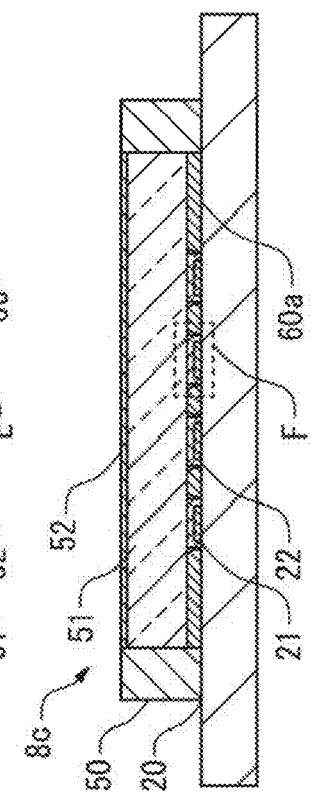
FIG. 21C is a cross-sectional view of a light emitting device according to an eighth modification.
Figure 21D:
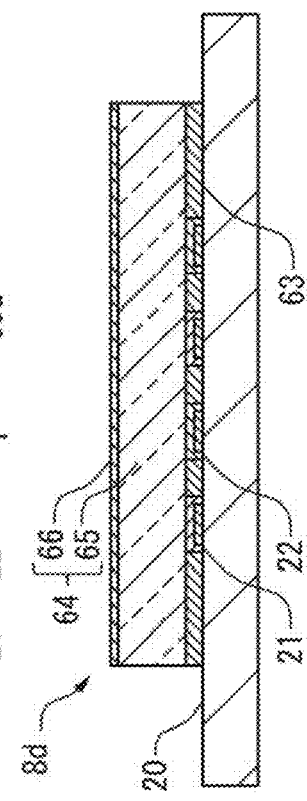
FIG. 21D is a cross-sectional view of a light emitting device according to a ninth modification.

FIG. 21A is a cross-sectional view of a light emitting device according to a sixth modification, FIG. 21B is a cross-sectional view of a light emitting device according to a seventh modification, FIG. 21C is a cross-sectional view of a light emitting device according to an eighth modification, and FIG. 21D is a cross-sectional view of a light emitting device according to a ninth modification. FIG. 21E is an enlarged view of a portion indicated by an arrow D in FIG. 21A, FIG. 21F is an enlarged view of a portion indicated by an arrow E in FIG. 21B, and FIG. 21G is an enlarged view of a portion indicated by an arrow F in FIG. 21C. FIG. 21A to FIG. 21D are cross-sectional views corresponding to the cross-sectional view along the line A-A' shown in FIG. 2.

A light emitting device 8f is different from the light emitting device 8b in that the light emitting device 8f includes a white resin 60. Since configurations and functions of components in the light emitting device 8f except for the white resin 60 are the same as those in the light emitting device 8b having the same reference numerals, a detailed description thereof will be omitted.

Similarly to the reflector 42, the white resin 60 is formed of a silicone resin containing white particles such as titanium oxide, and is arranged among the first and second light emitting elements 21 and 22. In the light emitting device 8f, since the white resin 60 is arranged among the first and second light emitting elements 21 and 22, the amount of light absorbed by the substrate 40 is suppressed, and therefore the luminous efficacy may be improved. The reflector 50 and diffusion layer 53 may be omitted.

A light emitting device 8g is different from the light emitting device 8f in that the light emitting device 8g includes first light emitting elements 61 and second light emitting elements 62 instead of the first and second light emitting elements 21 and 22. Since configurations and functions of components in the light emitting device 8g except for the first light emitting elements 61 and the second light emitting elements 62 are the same as those in the light emitting device 8f having the same reference numerals, and a detailed description thereof will be omitted.

The first and second light emitting elements 61 and 62 are different from the first and second light emitting elements 21 and 22 in that the side surfaces of the fluorescent resins included in the first light emitting elements 61 and second light emitting elements 62 are arranged so as not to extend in the vertical direction, but to incline outwardly toward the upper direction. In the light emitting device 8g, since the white resin 60 is arranged among the first and second light emitting elements 61 and 62, the white resin 60 functions as a reflector, and therefore the luminous efficiency may be further improved. The reflector 50 and the diffusion layer 53 may be omitted.

A light emitting device 8h is different from the light emitting device 8f in that the light emitting device 8h includes a white resin 60a instead of the white resin 60. Further, the light emitting device 8h is different from the light emitting device 8f in that the light emitting device 8h includes transparent resins 60b. Since configurations and functions of components in the light emitting device 8h except for the white resin 60a and the transparent resins 60b are the same as those in the light emitting device 8f having the same reference numerals, and a detailed description thereof will be omitted.

The white resin 60a is different from the white resin 60 in that recesses for the transparent resins 60b are formed among the first and second light emitting elements 21 and 22. Since configurations and functions of the white resin 60a except for the configuration in which the recesses are formed are the same as those of the white resin 60, a detailed description thereof will be omitted. The transparent resins 60b are arranged among the first and second light emitting elements 21 and 22 and the white frames 63. The transparent resins 60b are arranged along side surfaces of the fluorescent resins 25 of the first and second light emitting elements 21 and 22, and a side surface of transparent resin 60b is arranged so as to incline outwardly toward the upper direction.

A light emitting device 8i is different from the light emitting device 8f in that a white frame 63 and a frame member 64 are arranged instead of the reflector 50, the light guide layer 51, the diffuser layer 52 and the white resin 60. Since configurations and functions of components in the light emitting device 8i except for the white frame 63 and the frame material 64 are the same as those in the light emitting device 8f having the same reference numerals, and a detailed description thereof will be omitted.

The white frame 63 is formed of a white resin material having rigidity higher than that of the white resin 60, a plurality of insertion holes in each of which the first and second light emitting elements 21 and 22 are inserted are formed through the white frame 63. The frame material 64 includes a light guide layer 65 and a diffusion layer 66 which is adhered to the light guide layer 65. The light guide layer 65 is a transparent sheet for transmitting light emitted from the first and second light emitting elements 21 and 22, and the diffusion layer 66 is a diffusion sheet for diffusing the light emitted from the first light emitting elements 21 and the second light emitting elements 22.

Figure 22:
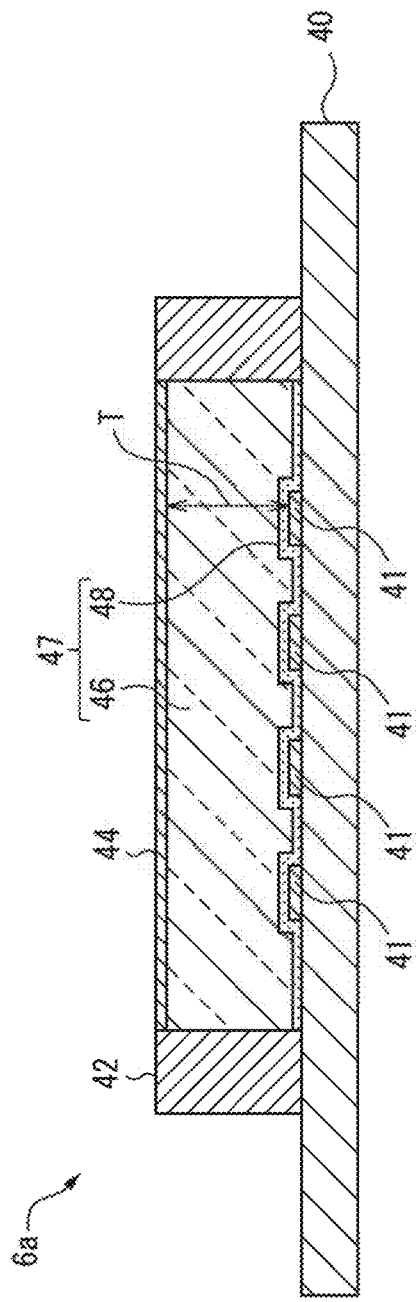
FIG. 22 is a cross-sectional view of a light emitting device according to a tenth modification.

FIG. 22 is a cross-sectional view of a light emitting device according to a tenth modification. A light emitting device 6a is different from the light emitting device 6 in that the light emitting device 6a includes a light guide layer 47 instead of the light guide layer 43. Since configurations and functions of components in the light emitting device 6a except for the light guide layer 47 are the same as those in the light emitting device 6 having the same reference numerals, and a detailed description thereof will be omitted. The light guide layer 47 is different from the light guide layer 43 in that the light guide layer 47 includes a phosphor layer 48 instead of the phosphor layer 45. The phosphor layer 48 is unevenly distributed around the periphery of the first light emitting elements 41. The phosphor layer 48 is formed by sedimentation of phosphor, coating thereof, electrophoresis thereof, etc.

A thickness T between the upper surfaces of the first light emitting elements 41 and the upper surface of the light guide layer 47 is equal to or longer than T1 calculated by the equation (1) from a distance between adjacent first light emitting elements 41. Further, the thickness T between the upper surfaces of the first light emitting elements 41 and the upper surface of the light guide layer 47 is equal to or shorter than T2 calculated by the equation (2) from a distance between the two first light emitting elements 41 arranged through one first light emitting element 41.

In the light emitting device 6a, since the light emitted from the first light emitting elements 41 and the light emitted from the phosphor contained in the phosphor layer 48 unevenly distributed around the periphery of the first light emitting elements 41 are emitted through the transparent layer 46, light having a high color mixing property may be emitted.

The light emitting device 6a may be manufactured by a manufacturing method similar to that of the light emitting device 7a. First, a substrate 40 is prepared in a substrate preparation step. Then, in a light emitting element mounting step, first light emitting elements 41 are mounted on the substrate 40. Then, in a wire bonding step, the first light emitting elements 41 are electrically connected to a pair of anode and cathode electrodes arranged on the substrate 40 through bonding wires (not shown). Then, in a reflector arrangement step, a reflector 42 is arranged so as to surround the first light emitting elements 41. Then, in a light guide layer arrangement step, a light guide layer 47 is arranged. In a diffusion layer arrangement step, a diffusion layer 44 is arranged, and then the manufacturing process of the light emitting device 6a is finished.

The chromaticity of light emitted from the light emitting device 6a may be adjusted by adjusting the thickness of the diffusion layer 44. The chromaticity of light emitted from the transparent layer 46 in response to a current supplied to the first light emitting elements 41 is measured after the light guide layer arrangement step to arrange the light guide layer 47 is finished and before the diffusion layer arrangement step.

Then, the thickness of the light guide layer 47 to be arranged is determined, depending on the difference between the measured chromaticity and desired chromaticity. If the uncured raw material of the diffusion layer 44 applied by spraying or the like is cured to form the diffusion layer 44, the thickness of the light guide layer 47 to be arranged is determined by determining the amount of the uncured raw material of the diffusion layer 44 to be applied. The amount of the uncured raw material of the diffusion layer 44 to be applied is determined by referring to a table showing the relationship between the amount of the uncured raw material of the diffusion layer 44 to be applied and the amount of shift in chromaticity.

Figure 23:
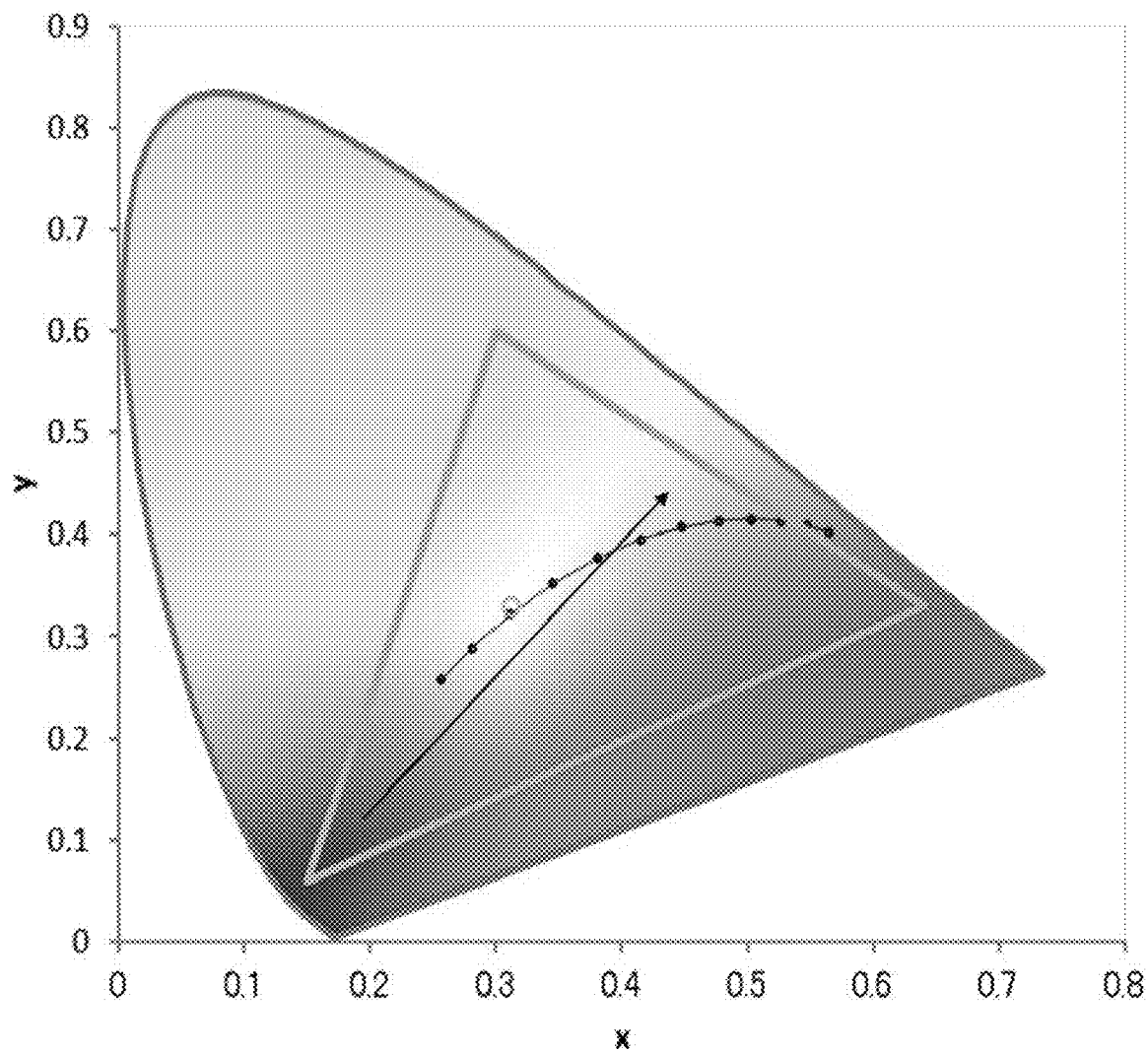
FIG. 23 is shows the relationship between the amount of the uncured raw material of the diffusion layer to be applied and the amount of shift in chromaticity.

FIG. 23 shows the relationship between the amount of the uncured raw material of the diffusion layer 44 to be applied and the amount of shift in chromaticity.

An increase in the amount of the applied uncured raw material of the diffusion layer 44 causes the thickness of the formed diffusion layer 44 to increase. An increase in the thickness of the formed diffusion layer 44 causes the amount of returning light that is reflected by the diffusion layer 44 and that transmits through the phosphor layer 48 to increase. An increase in the amount of returning light transmitting through the phosphor layer 48 causes the amount of light wavelength-converted from blue to yellow by the phosphor contained in the phosphor layer 48 to increase, causing the chromaticity of light emitted from the light emitting device 6a to be shifted in the direction indicated by an arrow in FIG. 23.

When the amount of shift to desired chromaticity of light emitted from the light emitting device 6a is small, the diffusion layer 44 is thinly arranged; when the amount of shift to desired chromaticity of light emitted from the light emitting device 6a is large, the diffusion layer 44 is thickly arranged.

Containing a diffusion material and a phosphor in the diffusion layer 44 improves the flexibility in adjustment to the chromaticity of emitted light depending on the thickness of the formed diffusion layer 44.

Figure 24:
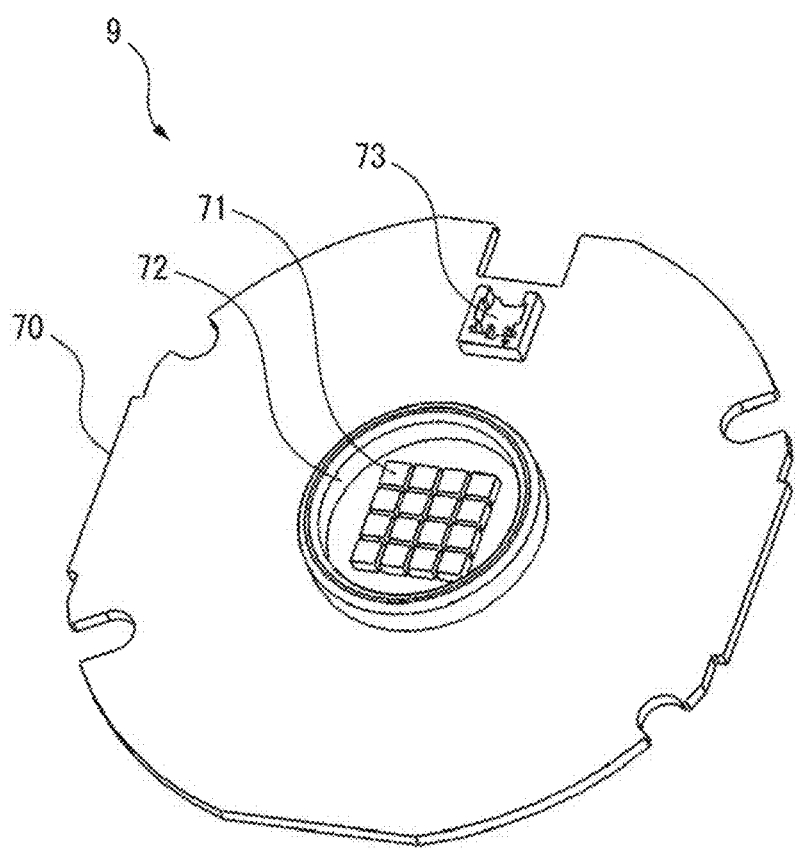
FIG. 24 is a perspective view of a light emitting device according to an eleventh modification.

FIG. 24 is a perspective view of a light emitting device according to an eleventh modification.

A light emitting device 9 includes a substrate 70, first light emitting elements 71, a light guide layer 72 and a connector 73. The substrate 70 is, for example, a glass epoxy substrate, and the wiring patterns for connecting among the first light emitting elements 71 and the connector 73 are formed. The first light emitting elements 71 are SMD-type light emitting elements, and are arranged in a matrix of 4×4 at the central portion of the upper surface of the substrate 70. The light guide layer 72 is formed of a silicone resin, and is arranged so as to cover the first light emitting elements 71.

A thickness of the light guide layer 72, i.e., a thickness between the upper surfaces of the LED dies of the first light emitting elements 71 and the upper surface of the light guide layer 72 is equal to or longer than T1 calculated by the equation (1) from a distance between adjacent first light emitting elements 71. Further, the thickness between the upper surfaces of the LED dies of the first light emitting elements 71 and the upper surface of the light guide layer 72 is equal to or shorter than T2 calculated by the equation (2) from a distance between two first light emitting elements 71 arranged through one first light emitting element 71.

The light emitting device 9 using COB-type light emitting elements may realize optical properties similar to those of a SMD-type light emitting device. Further, since the light emitting device 9 includes a plurality of electronic components mounted on the substrate 70, and a control circuit for controlling emissions of light from a plurality of first light emitting elements, etc., a light emitting device for realizing various controls such as dimming may be mounted on a single substrate.

Figure 25:
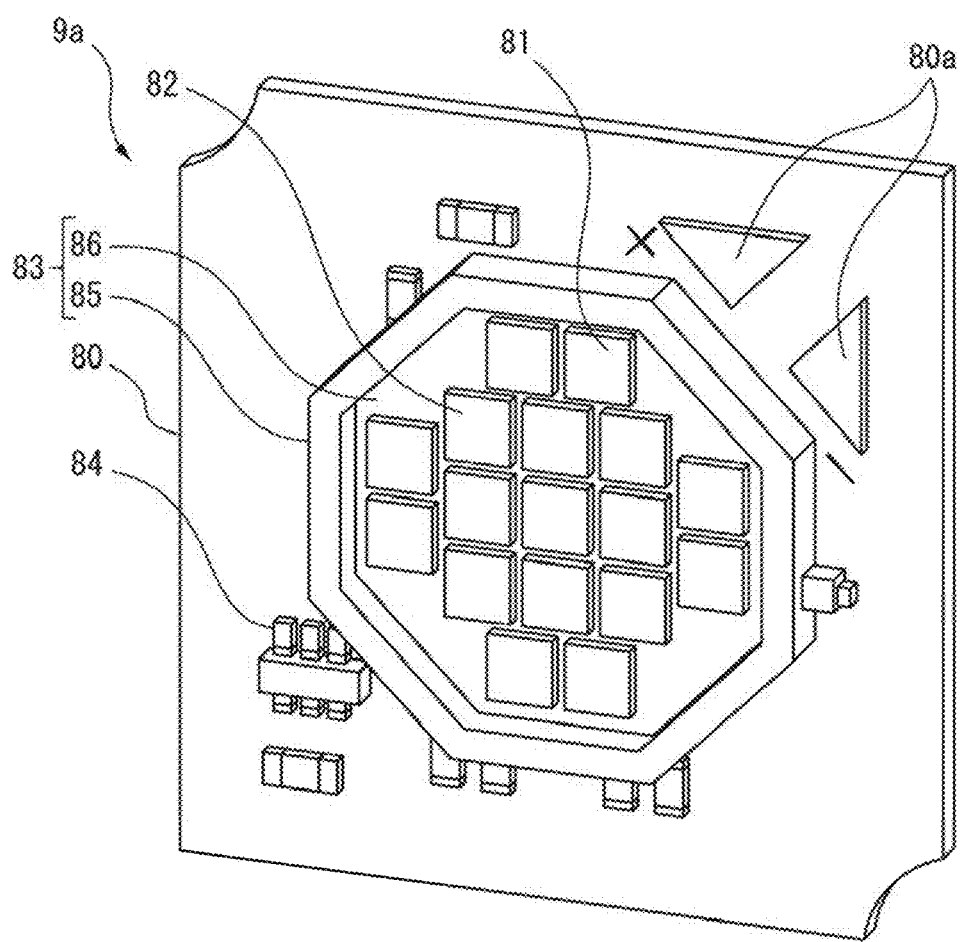
FIG. 25 is a perspective view of a light emitting device according to a twelfth modification.

FIG. 25 is a perspective view of a light emitting device according to a twelfth modification.

A light emitting device 9a includes a substrate 80, first light emitting elements 81, second light emitting elements 82, a frame member 83 and electronic components 84. The substrate 80 is an aluminum base substrate or a CEM3 substrate, a pair of electrodes 80a is arranged on the substrate 80, and wiring patterns for connecting among the first light emitting elements 81, the second light emitting elements 82, the electronic components 84 and the pair of electrodes 80a are formed thereon. Similarly to the first and second light emitting elements 21 and 22, the first and second light emitting elements 81 and 82 are CSP-type light emitting elements, the first light emitting elements 81 emit cold light, and the second light emitting elements 82 emit warm light. The frame material 83 includes a reflection portion 85 and a light guider 86 which is a light guide layer integrally molded with the reflection portion 85. The reflection portion 85 is a frame material formed of a synthetic resin for reflecting light emitted from the first and second light emitting elements 81 and 82, and is arranged so as to surround the first and second light emitting elements 81 and 82. The light guider 86 is a frame material formed of a synthetic resin for transmitting light emitted from the first and second light emitting elements 81 and 82, and is arranged so as to cover the first and second light emitting elements 81 and 82. The electronic components 84 include resistors, capacitors, MOSFET and semiconductor devices, etc., and provide various controls such as flicker suppression and dimming.

Figure 26:
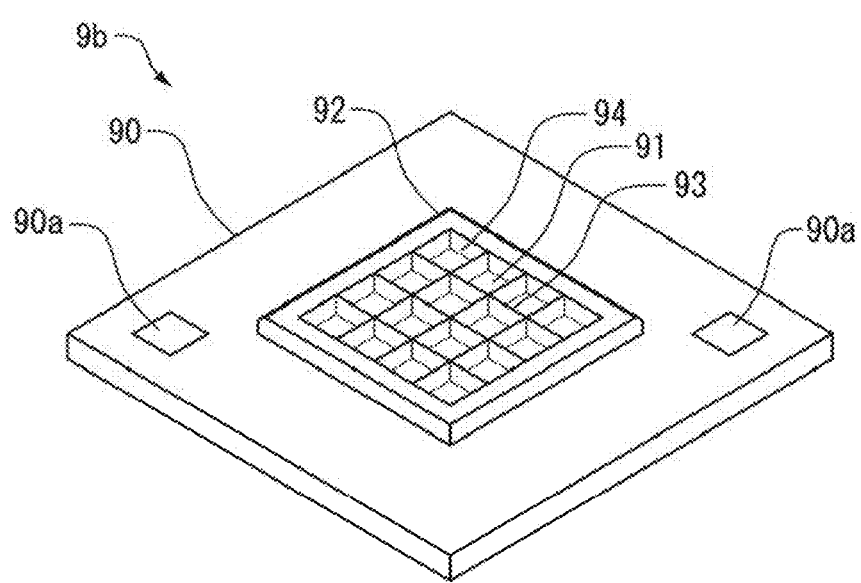
FIG. 26 is a perspective view of a light emitting device according to a thirteenth modification.

FIG. 26 is a perspective view of a light emitting device according to a thirteenth modification.

A light emitting device 9b includes a substrate 90, first light emitting elements 91, a frame member 92, a white resin 93, and a light transmitting layer 94. Similarly to the substrate 80, the substrate 90 is a glass epoxy substrate, an aluminum base substrate, or a CEM3 substrate, a pair of electrodes 90a is arranged on the substrate 90, and wiring patterns for connecting among the first light emitting elements 91 and the pair of electrodes 90a are formed thereon. Similarly to the LED dies 24, the first light emitting elements 91 are blue diodes and emit blue light. The frame member 92 is a white frame member and is arranged so as to surround the first light emitting elements 91. The white resin 93 is a white resin arranged so as to surround each of the first light emitting elements 91. The white resin 93 is taller than the first light emitting elements 91. The light transmitting layer 94 is a silicone resin containing a phosphor. The phosphor contained in the light transmitting layer 94 may be a single or two types of phosphor. When the light transmitting layer 94 contains two types of phosphor, the two types of phosphor may be separately arranged so as to correspond to the first light emitting elements 91.

FIG. 27 shows a manufacturing method of the light emitting device 9b, FIG. 27A shows a light emitting element mounting step, and FIG. 27B shows a frame member arrangement step.

First, in a light emitting element mounting step, first light emitting elements 91 are mounted on a substrate 90. Then, in a frame member arrangement step, a frame member 92 and a white resin 93 that are integrally molded are arranged on the substrate 90. Then, in a light transmitting layer formation step, a light transmitting layer 94 is formed. The light transmitting layer 94 is formed by heating the substrate 90 after an uncured resin of the light transmitting layer 94 is filled inside the frame member 92.

In the light emitting device 7a, the first and second light emitting elements 21 and 22 are CSP-type light emitting elements, and the diffusion layer 44a is arranged, in the light emitting device according to the embodiment, blue light emitting elements and a phosphor layer may be arranged, instead of the CSP-type light emitting elements and the diffusion layer 44a. When blue light emitting elements and a phosphor layer are arranged, instead of the CSP-type light emitting elements and the diffusion layer 44a, the light emitting device may be of a remote phosphor structure type. In the phosphor layer arranged instead of the diffusion layer 44a, the phosphor contained in the resin may be deposited before curing to arrange the phosphor on the interface with the light transmitting layer.

When a phosphor layer is arranged on the upper surfaces of the blue LED dies 24 of the first and second light emitting elements 21 and 22, the phosphor layer may be arranged by electrostatic coating on the upper surface of the blue LED die 24. When a phosphor layer is arranged by electrostatic coating on the upper surfaces of the blue LED dies 24, electrostatic discharge of the blue LED dies 24 may be prevented by grounding the electrodes of the flip-chip connected blue LED dies 24. When a phosphor layer is arranged by electrostatic coating on the upper surfaces of the blue LED dies 24, an electrostatic coating process may be performed on a mounting substrate, and blue LED dies 24 may be mounted on a mounting substrate after electrostatic coating on a coated substrate.

The light emitting device according to the present disclosure may emit light having a high color mixing property while suppressing a decrease amount of light flux, by arranging a light guide layer having a predetermined thickness between light emitting elements and a diffusion layer. In a light emitting device including a light guide layer according to the present disclosure, a variation range of the brightness of emitted light may be suppressed about 20% to 30% as compared with a light emitting device including no light guide layers. Further, in a light emitting device including a light guide layer and a diffusion layer according to the present disclosure, a variation range of the brightness of emitted light may be suppressed about 40% to 60% as compared with a light emitting device including no light guide layers.

Further, in a light emitting device having a light guide layer according to the present disclosure, a variation range of a chromaticity of emitted light may be suppressed about 3% to 30% as compared with a light emitting device including no light guide layers. Further, in a light emitting device having a light guide layer and a diffusion layer according to the present disclosure, the variation range of the chromaticity of emitted light may be suppressed about 45% to 75% as compared with a light emitting device including no light guide layers.

Although, in the above-described light emitting devices, the light guide layer is formed of a silicone resin, in the light emitting device according to the present disclosure, a light guide layer may be formed of a synthetic resin such as an epoxy resin, a polymethyl methacrylate resin, a polycarbonate resin or a polystyrene resin. Further, although, in the above-described light emitting device, the light guide layer is formed of a silicone resin which is a single resin, a light guide layer may be formed by laminating a plurality of synthetic resins having different refractive indices. When a light guide layer is formed by laminating a plurality of synthetic resins having different refractive indices, a thickness of the light guide layer is determined by calculating the equations (1) to (4) for each of resin layers.

Further, in a light emitting device according to the present disclosure, the reflective layer may be formed by a plurality of reflective layers arranged by superimposing on a substrate. When a reflective layer is formed by a plurality of reflective layers arranged by superimposing on a substrate, the center portion of the reflective layer arranged at the uppermost portion may be arranged outside the center portions of the other reflective layers. Since the center portion of the reflective layer arranged at the uppermost portion is arranged outside the center portions of the other reflective layers, when an uncured resin of a light guide layer is filled in a region surrounded by the reflector, the uncured resin of the light guide layer does not rise up to the uppermost portion of the reflective layer, and therefore a light guide layer having a flat upper surface may be formed.

The above-described light emitting elements include LED dies 24 emitting blue light and coated with fluorescent resins, etc. In a light emitting device including a color filter, when one white LED is arranged in an area covered by one color of the color filter, and other white LEDs are arranged in areas covered by other colors, a set of a color area and a white LED arranged in the corresponding area form a light emitting element. An aggregation of the entire color filters and the white LEDs correspond to light emitting elements. A light emitting device using a white LED and a color filter as a light emitting element has relationships described with reference to the equations (1) to (4). Similarly, a micro LED in which fine light emitting portions are arranged and organic EL have the relationships described with reference to the equations (1) to (4). Further, if light emission amounts of individual light emitting elements may be independently controlled, a light emitting device according to the present disclosure may be used as a display. However, the light emitting device according to the present disclosure may improve the uniformity of the brightness and color mixing property of emitted light, without reducing the resolution thereof.

What is claimed is:

1. A light emitting device comprising:
a substrate;
a plurality of first light emitting elements, each of which is mounted on the substrate, has a first LED die, and emits light having a first wavelength;
a first light transmitting layer arranged so as to cover the plurality of first light emitting elements, the first light transmitting layer transmitting light emitted from the plurality of first light emitting elements;
a second light transmitting layer arranged so as to cover the first light transmitting layer, the second light transmitting layer transmitting light that has transmitted through the first light transmitting layer; and
a reflector having an upwardly bulging curved surface at an upper portion of an inner wall that the first light transmitting layer and the second light transmitting layer contact, the reflector being arranged on the substrate so as to surround the plurality of first light emitting elements and reflecting light emitted from the first light emitting elements, wherein
the thickness T between the upper surfaces of the first LED dies and the upper surface of the first light transmitting layer is greater than a thickness T1 defined as $$T1 = LG1/(2\tan\theta c)$$

wherein LG1 is the distance between the first LED dies, and θc is a critical angle for the case where light is emitted from the first light transmitting layer to air,
the horizontal distance between a second contact part, where the top of the second light transmitting layer contacts the curved surface of the reflector, and the bottom of the inner wall of the reflector is greater than the horizontal distance between a first contact part, where the top of the first light transmitting layer contacts the reflector, and the bottom of the inner wall of the reflector,
the first light transmitting layer contacts the curved surface at the first contact part in the vicinity of the upper surface of the reflector,
the first light transmitting layer extends from the first contact part in a direction inclined by the contact angle of the uncured resin of the first light transmitting layer with respect to the reflector and an angle corresponding to the tangential direction at the first contact part, and
the first light transmitting layer at the center of a mounting region where the plurality of first light emitting elements is mounted is thinner than the first light transmitting layer at the first contact part.

2. The light emitting device according to claim 1, wherein the second contact part, where the top of the second light transmitting layer contacts the curved surface of the reflector, is higher than the first contact part, where the top of the first light transmitting layer contacts the reflector.

3. The light emitting device according to claim 1, wherein the thickness of the first light transmitting layer decreases with the distance from the first contact part.

4. The light emitting device according to claim 1, wherein
the first light emitting elements are blue light emitting elements that emit blue light,
the first light transmitting layer is a light guide layer that guides light emitted from the plurality of first light emitting elements to the second light transmitting layer, and
the second light transmitting layer is a fluorescent layer containing a phosphor that absorbs blue light guided through the light guide layer to emit light.

5. The light emitting device according to claim 1, further comprising a white resin arranged so as to surround each of the plurality of first light emitting elements.

6. The light emitting device according to claim 1, wherein
the second light transmitting layer contacts the curved surface at the second contact part in the vicinity of the upper surface of the reflector, and
the second light transmitting layer extends from the second contact part in a direction inclined by the contact angle of the uncured resin of the second light transmitting layer with respect to the reflector and an angle corresponding to the tangential direction at the second contact part.

7. The light emitting device according to claim 1, wherein the reflector includes a plurality of layers being superposed.

8. The light emitting device according to claim 7, wherein one of the plurality of layers is narrower than another of the plurality of layers arranged between the one of the plurality of layers and the substrate.

9. The light emitting device according to claim 1, wherein the second light transmitting layer at the center of a mounting region where the plurality of first light emitting elements is mounted is thicker than the second light transmitting layer at the second contact part.

10. The light emitting device according to claim 9, wherein the thickness of the second light transmitting layer increases with the distance from the second contact part.

11. The light emitting device according to claim 1, wherein
the first light transmitting layer is a light guide layer that guides light emitted from the plurality of first light emitting elements to the second light transmitting layer, and
the second light transmitting layer is a diffusion layer that diffuses light guided through the light guide layer.

12. The light emitting device according to claim 11, wherein the second light transmitting layer contains a first diffusion material and a second diffusion material that differs in composition from the first diffusion material.

13. A manufacturing method of a light emitting device, comprising:
a substrate preparation step to prepare a substrate;
a light emitting element mounting step to mount a plurality of first light emitting elements each having a first LED die on the substrate;
a reflector arrangement step to arrange a reflector so as to surround the plurality of first light emitting elements;
a first light transmitting layer arrangement step to arrange a first light transmitting layer so as to cover the plurality of first light emitting elements; and
a second light transmitting layer arrangement step to arrange a second light transmitting layer so as to cover the first light transmitting layer, wherein
the reflector has an upwardly bulging curved surface at an upper portion of an inner wall that the first light transmitting layer and the second light transmitting layer contact, and the reflector is arranged on the substrate so as to surround the plurality of first light emitting elements and reflects light emitted from the plurality of first light emitting elements,
the thickness T between the upper surfaces of the first LED dies and the upper surface of the first light transmitting layer is greater than a thickness T1 defined as $$T1 = LG1/(2\tan\theta c)$$

wherein LG1 is the distance between the first LED dies, and θc is a critical angle for the case where light is emitted from the first light transmitting layer to air, the horizontal distance between a second contact part, where the top of the second light transmitting layer contacts the curved surface of the reflector, and the bottom of the inner wall of the reflector is greater than the horizontal distance between a first contact part, where the top of the first light transmitting layer contacts the reflector, and the bottom of the inner wall of the reflector, the first light transmitting layer contacts the curved surface at the first contact part in the vicinity of the upper surface of the reflector, the first light transmitting layer extends from the first contact part in a direction inclined by the contact angle of the uncured resin of the first light transmitting layer with respect to the reflector and an angle corresponding to the tangential direction at the first contact part, and the first light transmitting layer at the center of a mounting region where the plurality of first light emitting elements is mounted is thinner than the first light transmitting layer at the first contact part.

14. The manufacturing method according to claim 13, wherein the second light transmitting layer arrangement step comprises the steps of:

applying an uncured raw material of the second light transmitting layer containing a diffusion material; and curing the applied uncured raw material of the second light transmitting layer to form the second light transmitting layer having a uniform thickness.

15. The manufacturing method according to claim 14, further comprising the steps of:

measuring the chromaticity of light emitted from the first light transmitting layer in response to a current supplied to the plurality of first light emitting elements, before the second light transmitting layer arrangement step; and determining the amount of the uncured raw material of the second light transmitting layer to be applied, so that the chromaticity of light emitted from the second light transmitting layer is the same as predetermined chromaticity.

16. The manufacturing method according to claim 14, wherein the second light transmitting layer contacts the curved surface at the second contact part in the vicinity of the upper surface of the reflector, and the second light transmitting layer extends from the second contact part in a direction inclined by the contact angle of the uncured resin of the second light guide layer with respect to the reflector and an angle corresponding to the tangential direction at the contact part.

* * * * *